(12) United States Patent
Kuramitsu et al.

(10) Patent No.: US 7,709,929 B2
(45) Date of Patent: May 4, 2010

(54) CAPACITOR SHEET AND ELECTRONIC CIRCUIT BOARD

(75) Inventors: Kouichi Kuramitsu, Kawasaki (JP); Kazuo Fujita, Kawasaki (JP); Noboru Izuhara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/501,065

(22) Filed: Aug. 9, 2006

(65) Prior Publication Data

US 2008/0013295 A1 Jan. 17, 2008

(30) Foreign Application Priority Data

Mar. 16, 2006 (JP) .............................. 2006-072739

(51) Int. Cl.
*H01L 29/00* (2006.01)

(52) U.S. Cl. .............................. 257/532; 257/E27.025; 257/E27.048; 361/305; 361/311

(58) Field of Classification Search ................ 361/303, 361/305, 306, 308, 311, 313, 323; 261/13; 257/532, E27.025, E27.048

See application file for complete search history.

(56) References Cited

U.S. PATENT DOCUMENTS

| 6,606,237 B1 * | 8/2003 | Naito et al. ............... 361/306.3 |
| 7,193,009 B2 * | 3/2007 | Amou et al. ................ 524/575 |
| 2004/0125539 A1 * | 7/2004 | Murakami et al. ........ 361/306.1 |
| 2005/0122662 A1 * | 6/2005 | Hayashi et al. ........... 361/306.3 |
| 2005/0269287 A1 * | 12/2005 | Tsujimura et al. .............. 216/13 |

FOREIGN PATENT DOCUMENTS

| JP | 10-290075 | 10/1998 |
| JP | 2002-025856 | 1/2002 |
| JP | 2002-083892 | 3/2002 |
| JP | 2002-353384 | 12/2002 |
| JP | 2003-051427 | 2/2003 |
| JP | 2004-172602 | 6/2004 |

* cited by examiner

*Primary Examiner*—Cuong Q Nguyen
*Assistant Examiner*—Cathy N Lam
(74) *Attorney, Agent, or Firm*—Hanify & King, PC

(57) ABSTRACT

A disclosed capacitor sheet attached to an electronic apparatus comprises: a laminated body; a first penetration electrode penetrating the laminated body, the first penetration electrode being electrically connected to a terminal electrode of the electronic apparatus; a second penetration electrode disposed at an arrangement position different from that of the first penetration electrode on the laminated body, the second penetration electrode being electrically insulated from the first penetration electrode and penetrating the laminated body; at least one first conductor thin film electrically connected to the first penetration electrode and insulated from the second penetration electrode; and at least one second conductor thin film disposed so as to face the first conductor thin film via a dielectric layer, the second conductor thin film being electrically connected to the second penetration electrode and insulated from the first penetration electrode.

23 Claims, 25 Drawing Sheets

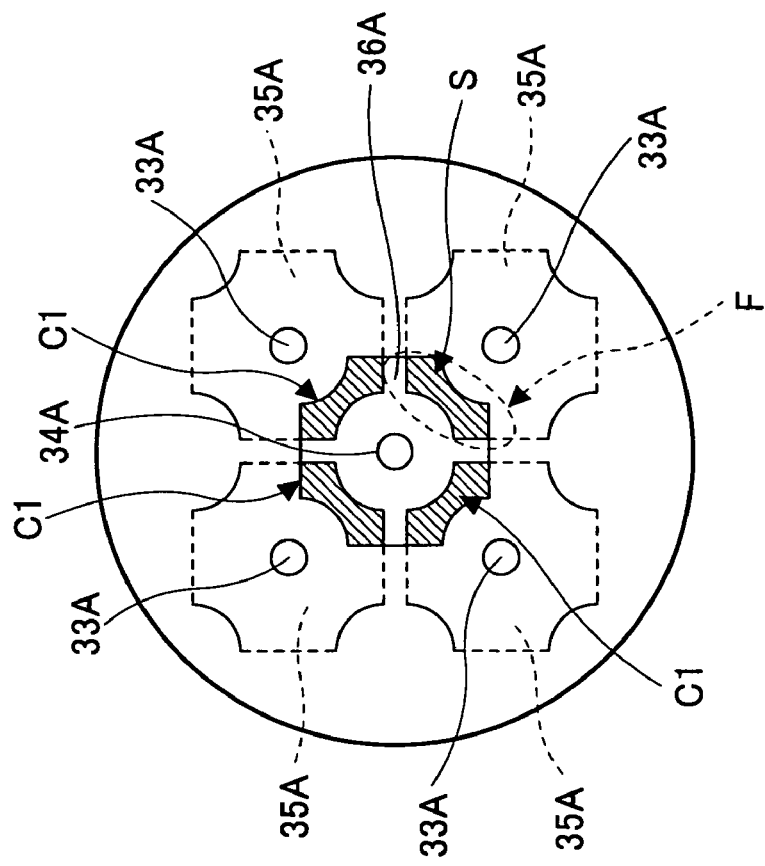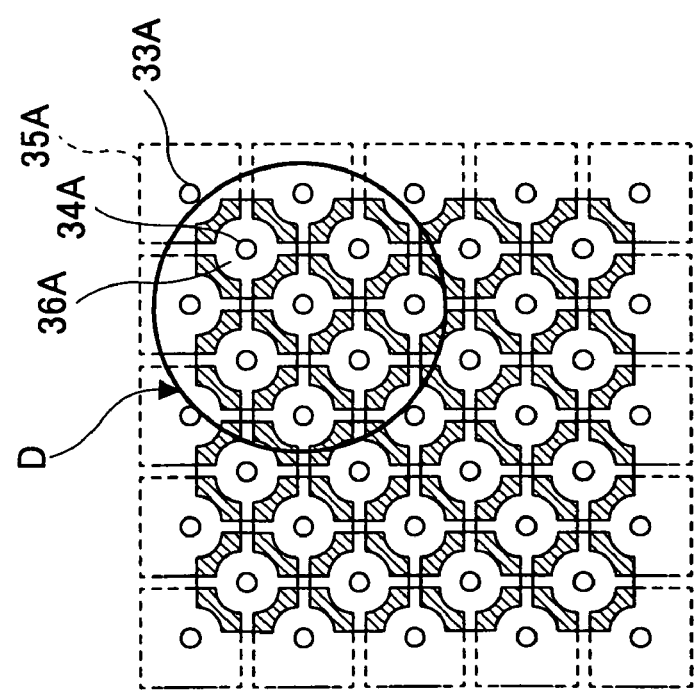
FIG.13A
FIG.13B

CAPACITOR SHEET AND ELECTRONIC CIRCUIT BOARD

BACKGROUND OF THE INVENTION

1. Field of the Invention

The present invention generally relates to a capacitor sheet and an electronic circuit board and especially to a capacitor sheet and an electronic circuit board for removing noises from LSI and the like on an electronic circuit board of general electronic devices including communication devices.

The present invention is used to remove high-frequency and low-frequency noises from electronic components such as LSIs mounted on electronic devices. Such noises may cause not only the generation of malfunctions in the electronic components but also negative influences on peripheral electronic components, so that a method for removing noises in which compatibility between performances and costs is ensured has been required.

2. Description of the Related Art

FIG. 1 is a perspective view showing an example of a communication apparatus requiring the removal of noises from LSIs and the like. A communication apparatus 101 shown in the drawing includes plural plug-in units 102 having an electronic circuit board 102a in which an LSI is mounted and a subrack 103 into which the plug-in units 102 are inserted for installation. The subrack 103 is stored in a subrack installation rack 104.

In the communication apparatus 101, the plug-in unit 102 is inserted into the subrack 103, a connector 102b of the plug-in unit 102 is connected to a backplane connector (omitted in the drawing) disposed in the subrack 103 and the plug-in unit 102 is electrically connected to the subrack 103.

FIGS. 2 and 3 are diagrams showing the plug-in unit 102 to which the conventional electronic circuit board 102a is applied. FIG. 2A is a rear view of the plug-in unit 102 and FIG. 2B is a front view of the plug-in unit 102. FIG. 3A is an enlarged view showing an area indicated by an arrow A of FIG. 2A and FIG. 3B is an enlarged view showing an area indicated by an arrow B of FIG. 2B.

As shown in each diagram, conventionally, a large number of capacitors 106 for removing noises (capacitor chips for high frequency and capacitor chips for low frequency) are mounted in the vicinity of an area where an LSI 105 of the electronic circuit board 102a is disposed and on a reverse side of the area where the LSI 105 is disposed.

With the acceleration of processing speed of the LSI 105, dealing with high-frequency noises of an LSI electrode has posed a problem. Conventionally, such a problem is handled by mounting a chip capacitor with good high-frequency characteristics on the vicinity of a terminal electrode of a power source of the LSI 105.

However, due to a high density of mounting in an electronic circuit on the electronic circuit board 102a, the mounting of a sufficient number of capacitors 106 with sufficient capacity has become difficult. Further, the mounted capacitor 106 has a long connection wiring distance to the terminal electrode of the LSI 105 due to a peripheral electronic circuit mounted in a high-density manner, leading wiring, through-holes, and the like in the vicinity of the power source of the LSI 105 and a terminal electrode for grounding. Thus, resistance components and inductance components of the connection wiring cannot be ignored and it is difficult to obtain sufficient electric characteristics.

In practice, an area in the vicinity of the LSI 105 is allocated to the capacitors 106 as large as possible so that many capacitors 106 are mounted using a minimal wiring. However, when the number of mounted capacitors is increased, a cost of members to be mounted and a processing cost thereof are increased. This may lead to high costs and an increase of failure rate, thereby degrading reliability.

FIG. 4 is a diagram showing the frequency characteristics of a capacitor. Usually, a capacitor for high-frequency noises has a high resonance frequency and small ESR and ESL. As described above, when a connection wiring distance between the capacitor 106 and the terminal electrode of the LSI 105 is increased, the effects of resistance components (ESR) and inductance components (ESL) of the connection wiring are added. Thus, it is difficult to obtain electric characteristics as originally expected.

In recent years, the use of a capacitor sheet as disclosed in Patent Documents 1 and 2 has been proposed as a method for solving such problems.

Patent Document 1: Japanese Laid-Open Patent Application No. 2002-25856

Patent Document 2: Japanese Laid-Open Patent Application No. 2002-83892

However, conventional capacitor sheets as disclosed in Patent Documents 1 and 2 are problematic in that such sheets are for exclusive use dependent on the pin arrangement (arrangement of terminal electrodes of signals, power source, and grounding) of each LSI and versatility cannot be provided. Further, conventional capacitor sheets have a sheet configuration such that the capacitor is formed between a single specific power source and a single specific ground. Thus, such sheets are problematic in that they cannot support an LSI with plural power sources.

SUMMARY OF THE INVENTION

It is a general object of the present invention to provide an improved and useful capacitor sheet and electronic circuit board in which the above-mentioned problems are eliminated.

A more specific object of the present invention is to provide a capacitor sheet and an electronic circuit board capable of certainly removing noises even when the processing speed of an electronic apparatus (LSI) is accelerated and the density of an electronic circuit board is increased.

According to one aspect of the present invention, there is provided a capacitor sheet attached to an electronic apparatus, comprising: a laminated body; a first penetration electrode penetrating the laminated body, the first penetration electrode being electrically connected to a terminal electrode of the electronic apparatus; a second penetration electrode disposed at an arrangement position different from that of the first penetration electrode on the laminated body, the second penetration electrode being electrically insulated from the first penetration electrode and penetrating the laminated body; at least one first conductor thin film electrically connected to the first penetration electrode and insulated from the second penetration electrode; and at least one second conductor thin film disposed so as to face the first conductor thin film via a dielectric layer, the second conductor thin film being electrically connected to the second penetration electrode and insulated from the first penetration electrode.

According to another aspect of the present invention, there is provided a capacitor sheet in which the first conductor thin film formed on one first penetration electrode faces the plural second conductor thin films at one time formed on the plural second penetration electrodes.

According to another aspect of the present invention, there is provided a capacitor sheet in which a clearance between the first conductor thin film and the second conductor thin film positioned above the first conductor thin film in a lamination direction is different from a clearance between the first conductor thin film and the second conductor thin film positioned below the first conductor thin film in the lamination direction.

According to the present invention, upper ends and lower ends of the first penetration electrode and the second penetration electrode are configured and arranged to serve as external connection terminals.

In the aforementioned configuration, the first penetration electrode may have a through-hole for a terminal electrode formed on the electronic apparatus and the terminal electrode may be inserted thereinto. A plurality of the first conductor thin films may be disposed and the plural first conductor thin films electrically connected to the plural first penetration electrodes may be integrated with one another. And a plurality of the second conductor thin films may be disposed and the plural second conductor thin films electrically connected to the plural second penetration electrodes may be integrated with one another.

According to another aspect of the present invention, there is provided an electronic circuit board comprising: a board electrode formed in an insulator layer; and a capacitor sheet according to the above-mentioned aspect of the present invention so as to connect the board electrode to first and second penetration electrodes.

In the aforementioned configuration, the board electrode may be selectively insulated.

Other objects, features and advantage of the present invention will become more apparent from the following detailed description when read in conjunction with the accompanying drawings.

BRIEF DESCRIPTION OF THE DRAWINGS

FIG. 13 is a diagram showing a capacitor sheet according to the first example of the present invention, describing how a capacitor is formed with a first conductor thin film and a second conductor thin film;

DESCRIPTION OF THE PREFERRED EMBODIMENTS

Figure 1:
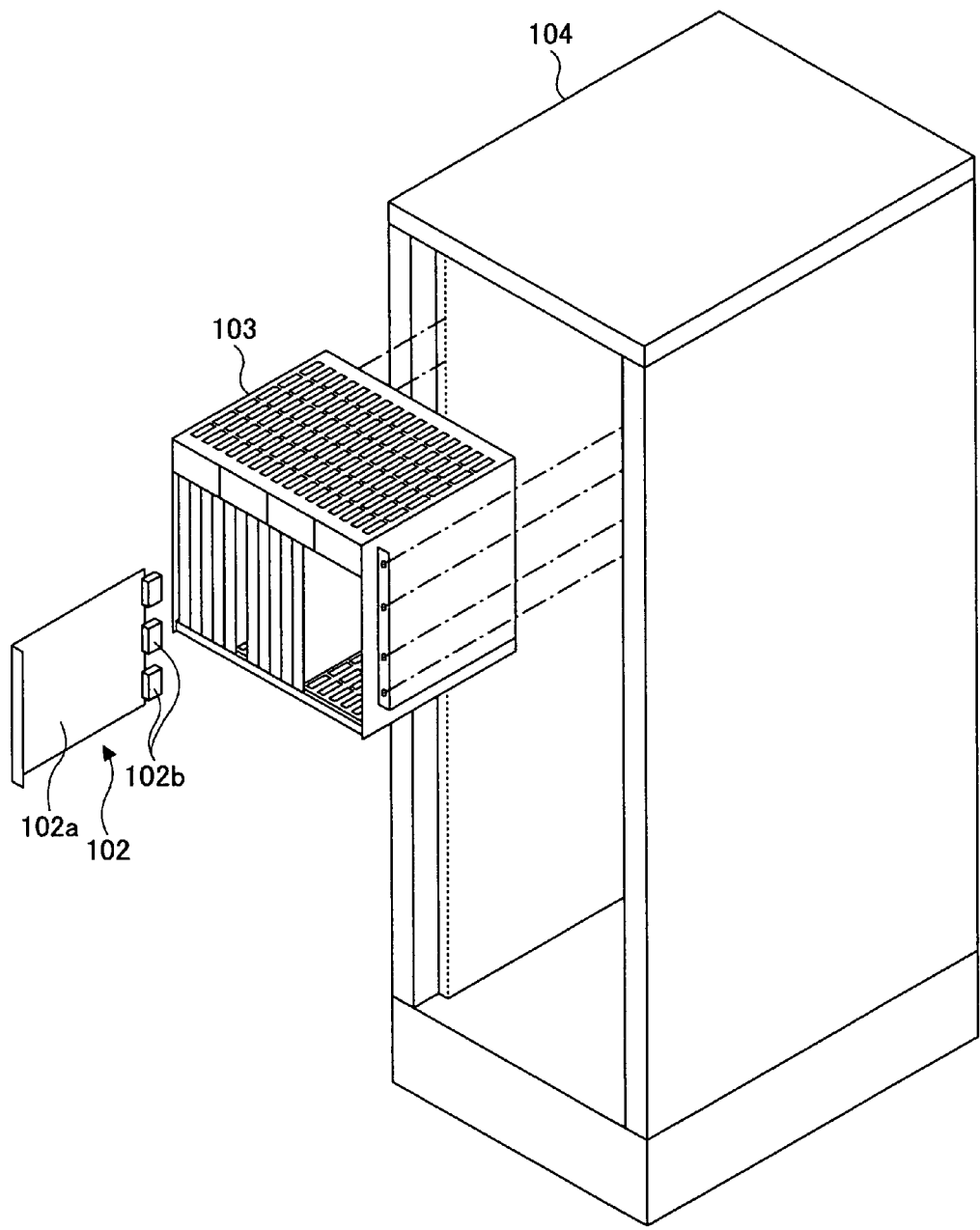
FIG. 1 is a perspective view showing an example of a communication apparatus in which a capacitor sheet is used.
Figure 2B:
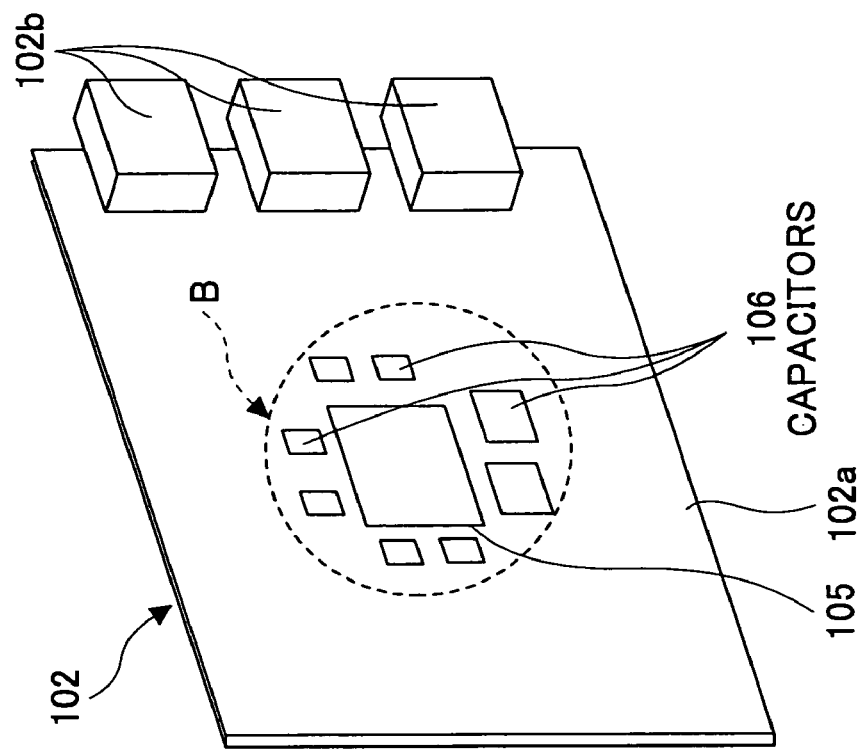
FIG. 2B is a front view of a plug-in unit in which a conventional electronic circuit board is used.
Figure 2A:
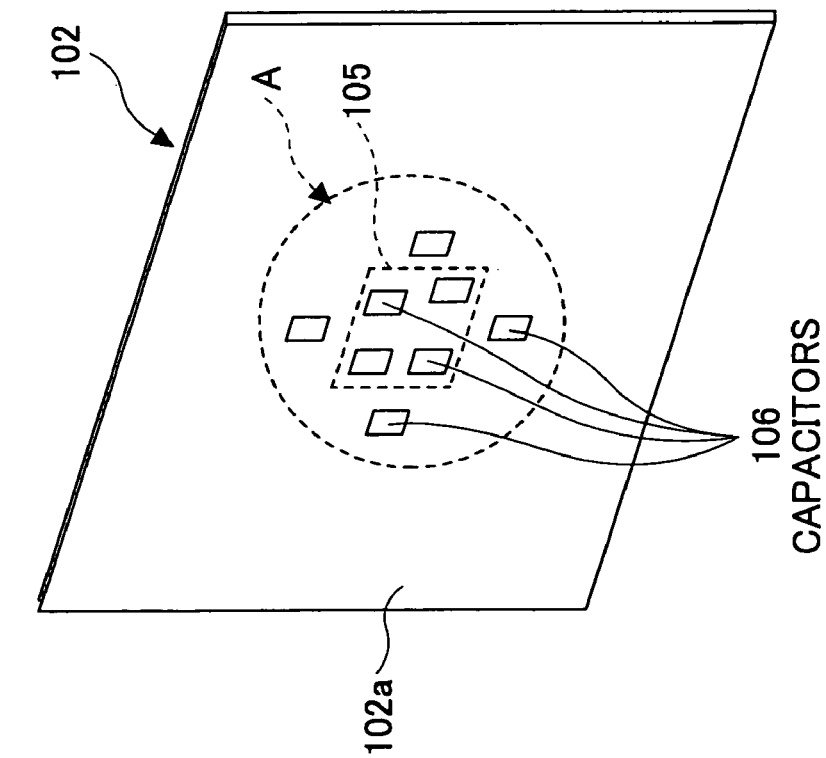
FIG. 2A is a rear view of a plug-in unit in which a conventional electronic circuit board is used.
Figure 3A:
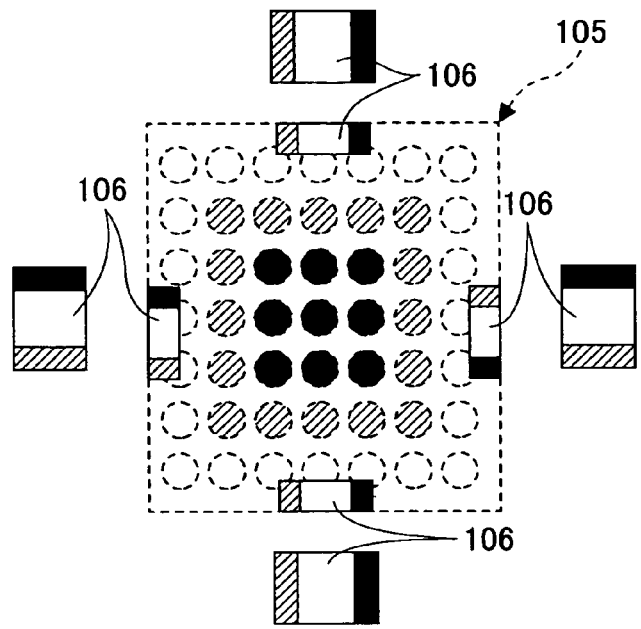
FIG. 3A is an enlarged view showing an area indicated by an arrow A of FIG. 2A, describing a method of arranging conventional capacitors for noise prevention.
Figure 3B:
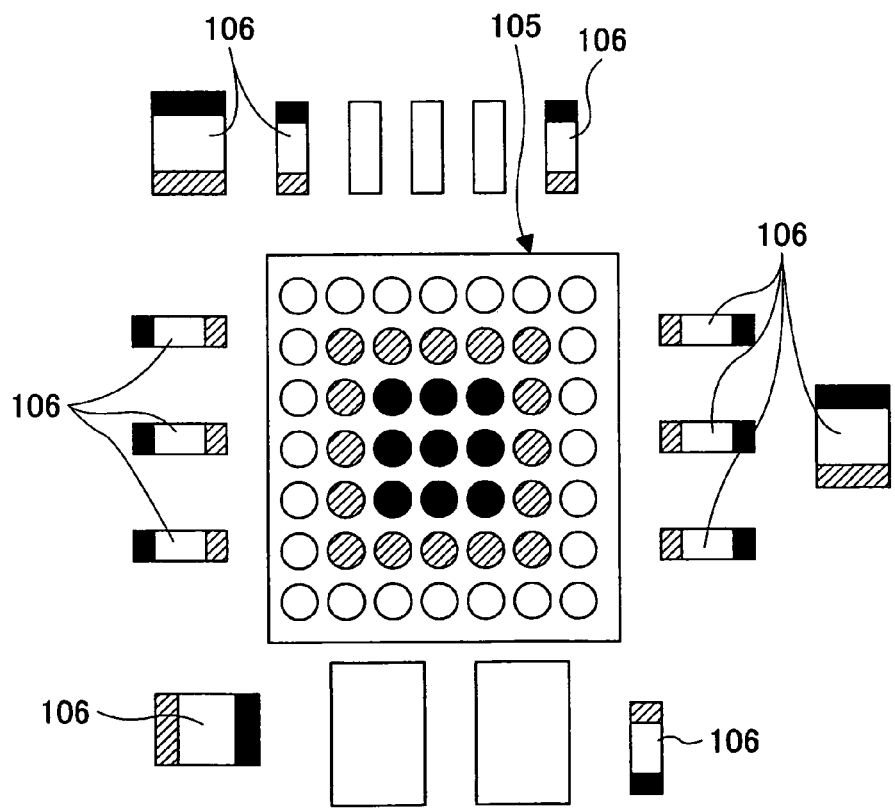
FIG. 3B is an enlarged view showing an area indicated by an arrow B of FIG. 2B, describing a method of arranging conventional capacitors for noise prevention.
Figure 4:
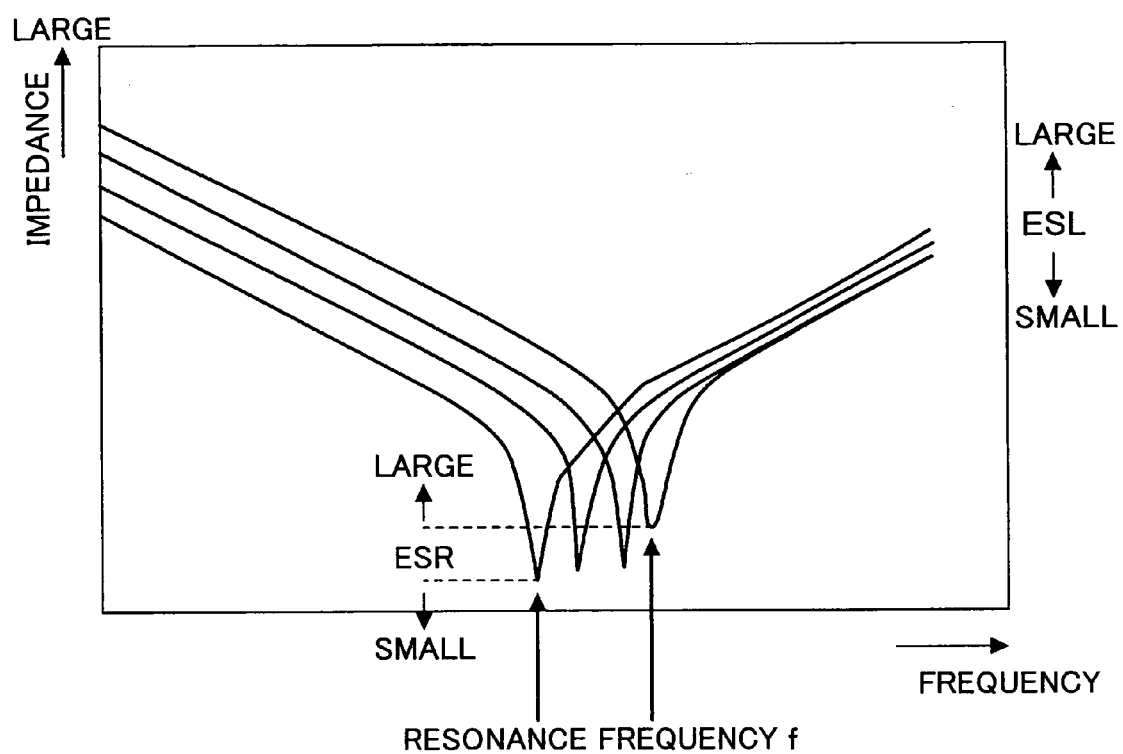
FIG. 4 is a diagram showing the frequency characteristics of a capacitor.
Figure 5:
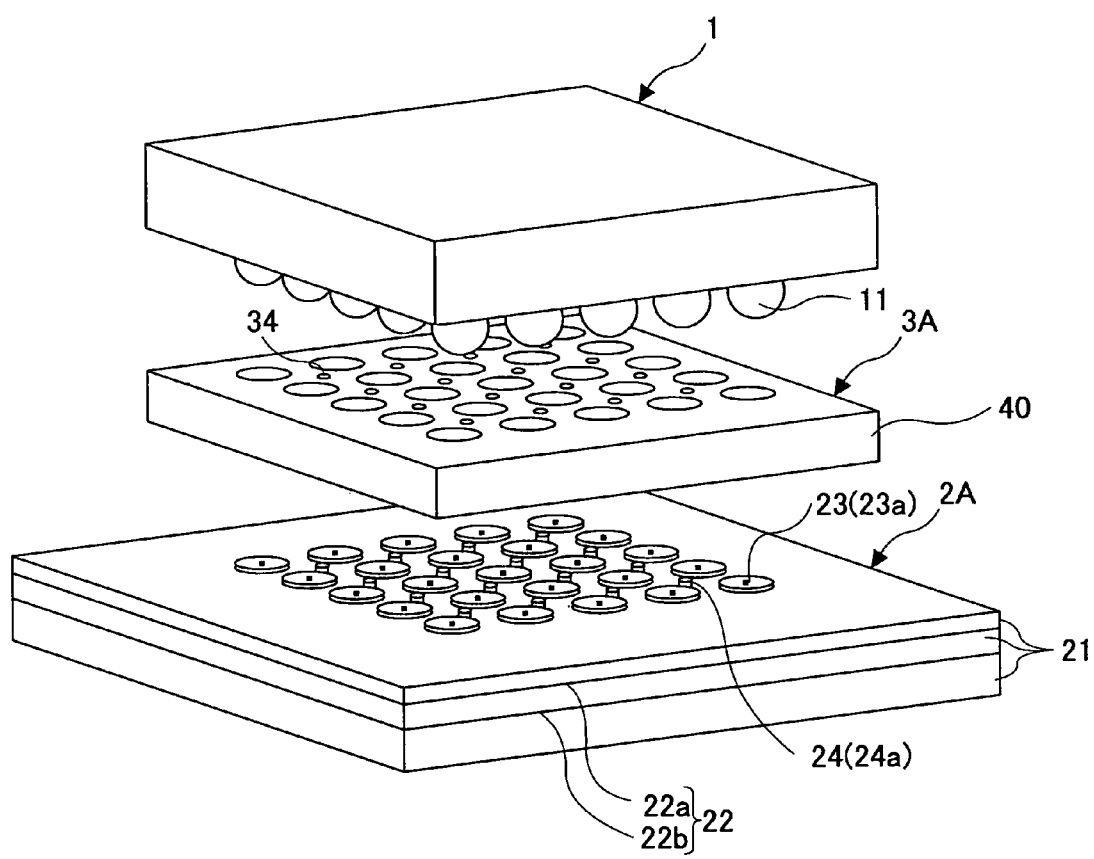
FIG. 5 is an exploded perspective view describing a first example of the present invention.
Figure 6:
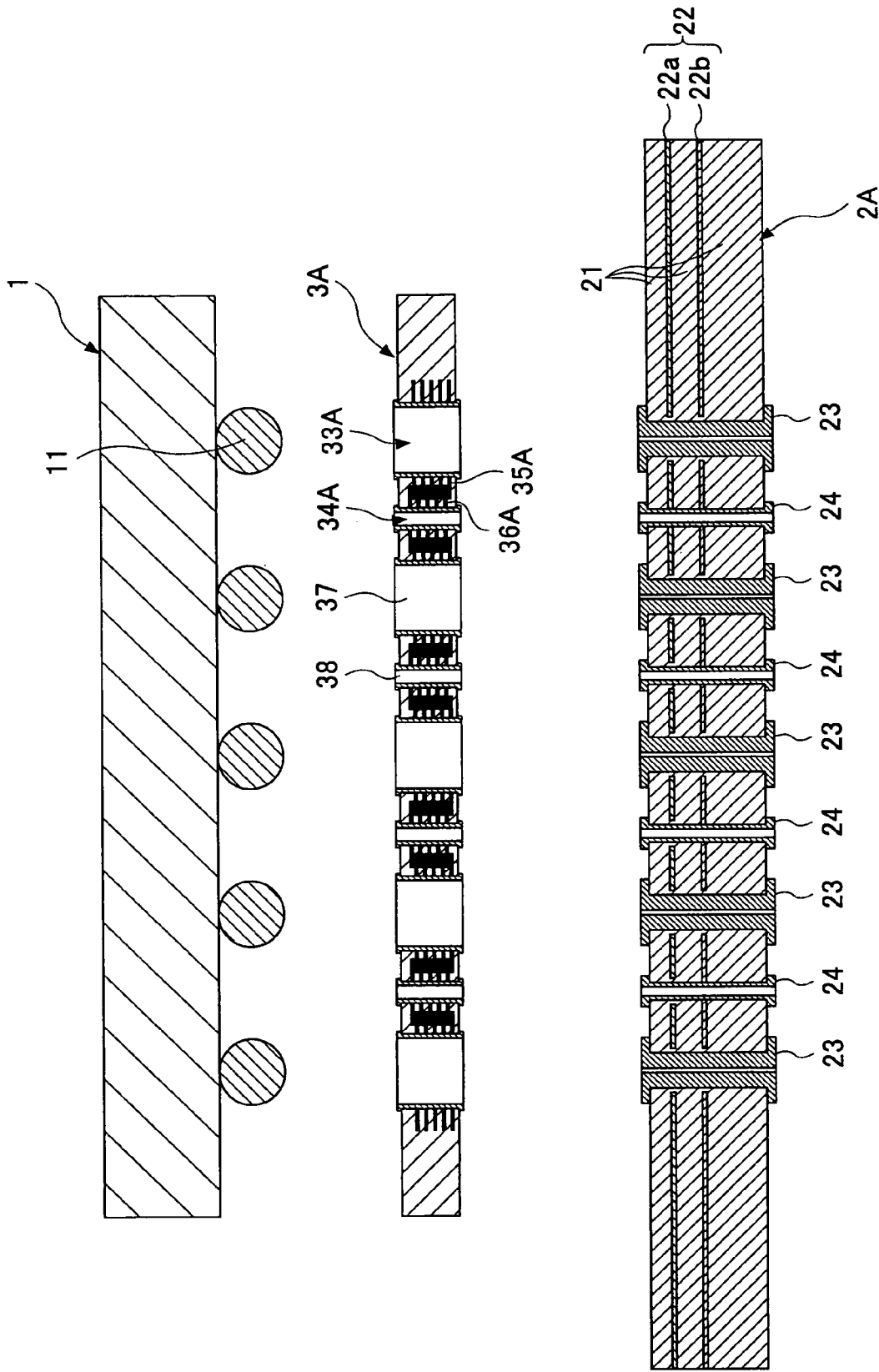
FIG. 6 is an exploded cross-sectional view describing the first example of the present invention.
Figure 7:
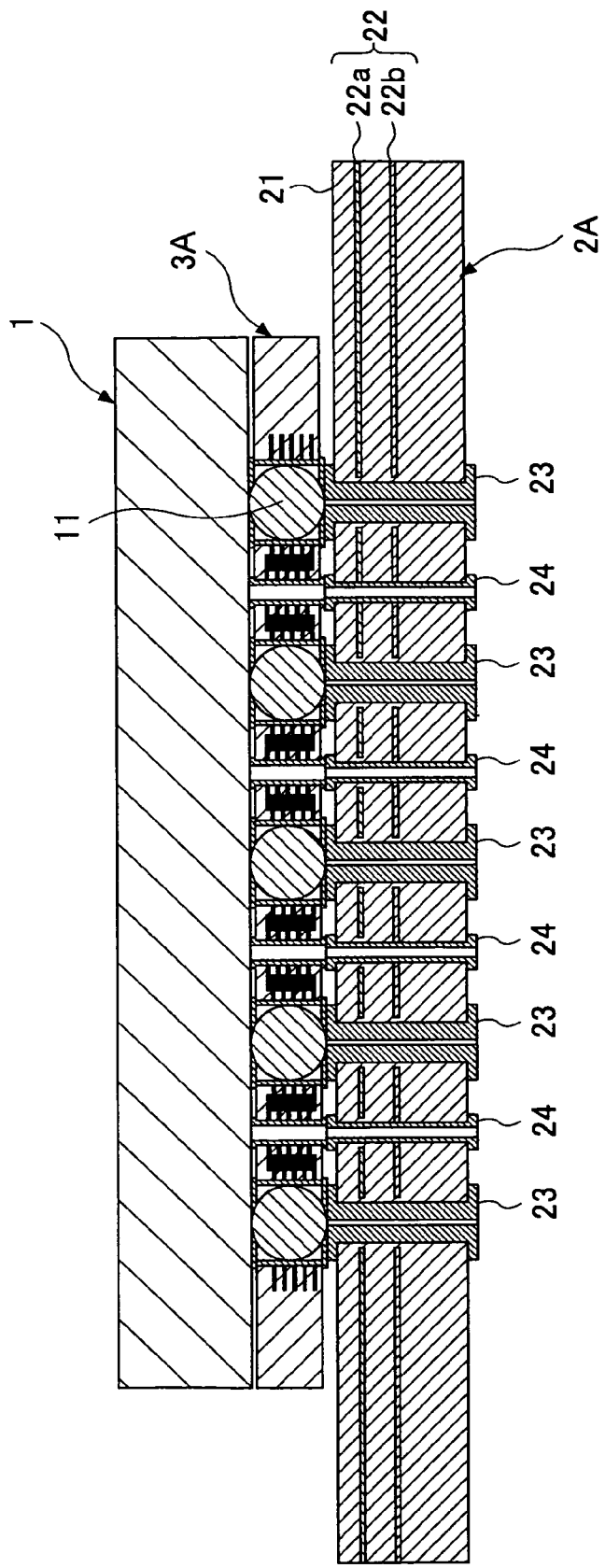
FIG. 7 is a cross-sectional view showing an LSI mounted on an electronic circuit board, describing the first example of the present invention.

In the following, embodiments of the present invention will be described with reference to the accompanying drawings.

FIGS. 5 to 14 are diagrams for describing a capacitor sheet and an electronic circuit board according to a first example of the present invention. FIGS. 5 to 8 are diagrams for describing a configuration in which an LSI 1 (electronic apparatus) is mounted on an electronic circuit board 2A via a capacitor sheet 3A. FIGS. 9 to 14 are diagrams for describing a specific configuration of the capacitor sheet 3A.

The processing speed of the LSI 1 in the present example is increased and plural terminal electrodes 11 are arranged on a lower surface (mounting surface) of the package. The terminal electrodes 11 are made of solder balls, for example.

The LSI 1 is mounted on the electronic circuit board 2A via the capacitor sheet 3A. The electronic circuit board 2A includes a laminated circuit board in which plural conductor layers 22a and 22b (hereafter collectively referred to as a conductor layer 22) and insulator layers 21 are stacked. The conductor layer 22a is configured to have power source electric potential and the conductor layer 22b is configured to have ground electric potential. On the electronic circuit board 2A, plural first board electrodes 23 and second board electrodes 24 are formed.

The first and second board electrodes 23 and 24 are formed while penetrating through the insulator layer 21 and the conductor layer 22. Pad portions 23a and 24a are formed on upper ends thereof and pad portions 23b and 24b are formed on lower ends thereof (refer to FIG. 8 for details). The pad portion 23a of the electronic circuit board 2A is electrically connected to a first penetration electrode 33A of a capacitor sheet 3A as will be described in the following and the pad portion 24a is electrically connected to a second penetration electrode 34A of the capacitor sheet 3A.

In the present example, a forming position of the first board electrodes 23 is set to correspond to a position where the terminal electrode 11 of the LSI 1 is disposed. Further, positions where the first board electrodes 23 are disposed and positions where the second board electrodes 24 are disposed are set such that, when four adjoining first board electrodes 23 are selected, the second board electrode 24 is disposed at a position where diagonal lines of the four adjoining first board electrodes 23 are crossed (namely, a central position) and, when four adjoining second board electrodes 24 are selected, the first board electrode 23 is disposed at a position where diagonal lines of the four adjoining second board electrodes 24 are crossed (namely, a central position).

Next, the capacitor sheet 3A will be described in the following.

The capacitor sheet 3A substantially includes a first penetration electrode 33A, a second penetration electrode 34A, a laminated body 40 (made of a first conductor thin film 35A, a second conductor thin film 36A, a dielectric layer 39, and the like), and the like. The first penetration electrode 33A is formed while penetrating through the laminated body 40 and gold plating (not limited to this) is applied to an inner circumferential portion of a first through-hole 37 formed in the dielectric layer 39 including polyimide, for example.

The second penetration electrode 34A is formed while penetrating through the laminated body 40 and is disposed at a position different from that of the first penetration electrode 33A such that the second penetration electrode 34A is insulated from the first penetration electrode 33A. In the second penetration electrode 34A, gold plating (not limited to this) is also applied to an inner circumferential portion of a second through-hole 38 formed in the dielectric layer 39.

The first and second penetration electrodes 33A and 34A are formed while penetrating through the dielectric layer 39, so that upper ends and lower ends thereof are exposed from an upper surface and a lower surface of the dielectric layer 39 so as to function as external connection terminals.

Further, an inner diameter of the first through-hole 37 is set to be substantially the same as a diameter of the terminal electrode 11 disposed on the LSI 1. As will be described in the following, when the terminal electrode 11 is inserted into the first through-hole 37, the terminal electrode 11 is electrically connected to the first through-hole 37. In addition, an inner diameter of the second through-hole 38 is not associated with the terminal electrode 11 and the inner diameter is set to be smaller than the first through-hole 37.

Moreover, a forming position of the first penetration electrode 33A is set to correspond to the first board electrode 23 formed in the electronic circuit board 2A and a forming position of the second penetration electrode 34A is set to correspond to the second board electrode 24 formed in the electronic circuit board 2A. Thus, by mounting the capacitor sheet 3A on the electronic circuit board 2A, the first penetration electrode 33A is electrically connected to the first board electrode 23 and the second penetration electrode 34A is electrically connected to the second board electrode 24.

Accordingly, in the present example, positions where the first penetration electrodes 33A are disposed and positions where the second penetration electrodes 34A are disposed are set such that, when four adjoining first penetration electrodes 33A are selected, the second penetration electrode 34A is disposed at a position where diagonal lines of the four adjoining first penetration electrodes 33A are crossed (namely, a central position) and, when four adjoining second penetration electrodes 34A are selected, the first penetration electrode 33A is disposed at a position where diagonal lines of the four adjoining second penetration electrodes 34A are crossed (namely, a central position).

Figure 12:
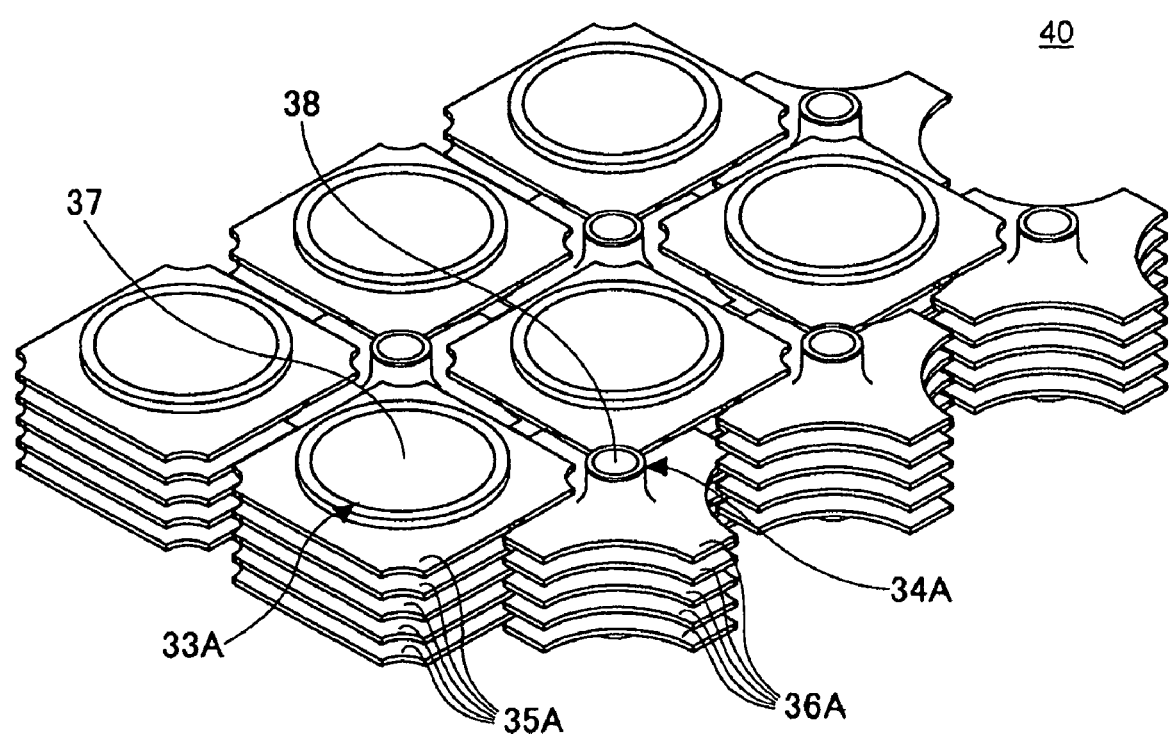
FIG. 12 is an enlarged perspective view showing the vicinity of a first penetration electrode and a second penetration electrode on a capacitor sheet according to the first example of the present invention.

On the other hand, the first penetration electrode 33A has plural (five in the present example) first conductor thin films 35A disposed thereon. As shown in FIGS. 12 and 13A, the first conductor thin film 35A is configured to be electrically connected to the first penetration electrode 33A and a form thereof is substantially rectangular in a plan view. The first conductor thin films 35A are stacked having the dielectric layer 39 disposed therebetween and an extending direction thereof is assumed to be a direction of a surface orthogonal relative to an axis direction of the first penetration electrode 33A (upward and downward directions in FIG. 14). Thus, the first conductor thin films 35A are disposed in parallel with one another.

The second penetration electrode 34A has plural (four in the present example) second conductor thin films 36A disposed thereon. The second conductor thin film 36A is electrically connected to the second penetration electrode 34A and a form thereof is a rectangle in a plan view, the rectangle having four corners chamfered to form curves. The second conductor thin films 36A are stacked having the dielectric layer 39 disposed therebetween and an extending direction thereof is assumed to be a direction of a surface orthogonal relative to an axis direction of the second penetration electrode 34A (upward and downward directions in FIG. 14). Thus, the second conductor thin films 36A are disposed in parallel with one another.

Figure 14:
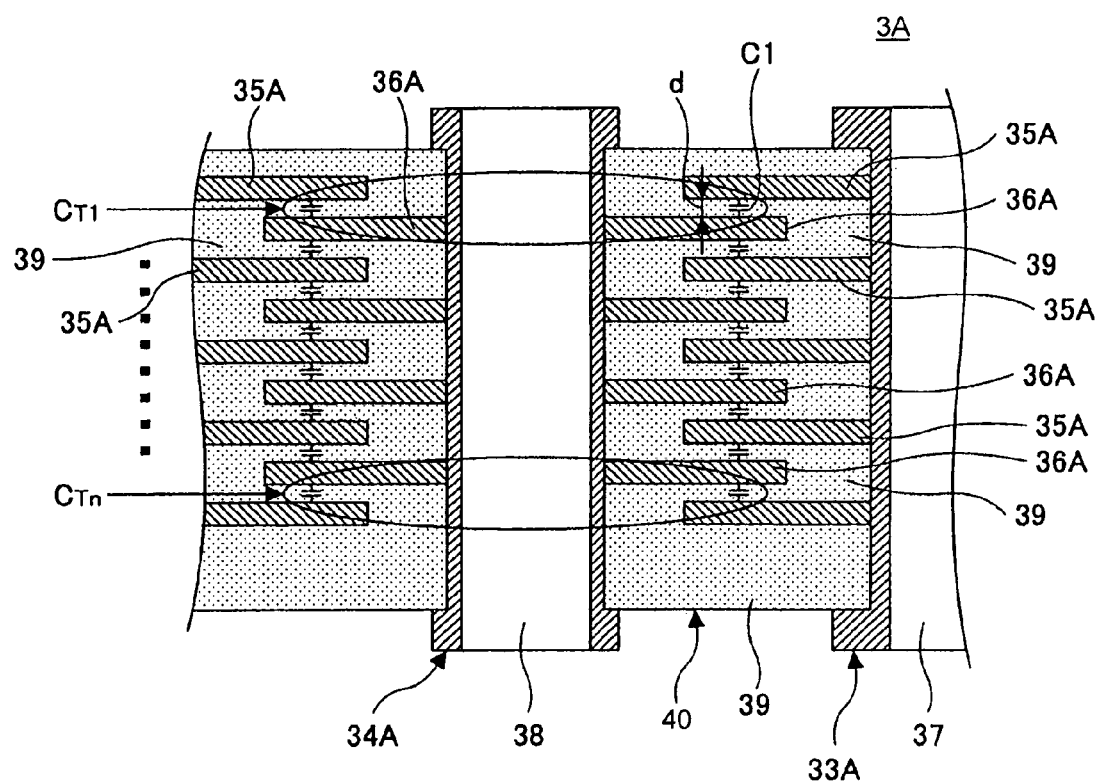
FIG. 14 is a diagram showing a capacitor sheet according to the first example of the present invention, describing how a capacitor is formed with a first conductor thin film and a second conductor thin film.

Further, as shown in FIGS. 12 and 14, the above-mentioned first conductor thin films 35A and the second conductor thin films 36A are stacked while having the dielectric layer 39 disposed therebetween, thereby forming the laminated body 40. In other words, each of the first conductor thin films 35A and second conductor thin films 36A is disposed in an opposing manner via the dielectric layer 39. Accordingly, a pair of the first conductor thin film 35A and the second conductor thin film 36A disposed in an opposing manner and the dielectric layer 39 disposed therebetween form a capacitor.

In the present example, capacitors are formed such that the four second conductor thin films 36A are inserted among the five first conductor thin films 35A one by one, so that eight capacitors are formed in total (refer to FIG. 14). Thus, by changing the number of the first conductor thin films 35A and the second conductor thin films 36A to be formed, it is possible to change the number of capacitors to be formed between the first penetration electrodes 33A and the second penetration electrodes 34A.

Next, description will be given regarding electrostatic capacity (capacitance) of the capacitor configured as mentioned above with reference to FIG. 13B. In this case, electrostatic capacity of a capacitor is obtained, the capacitor being formed between a single second penetration electrode 34A and four first penetration electrodes 33A surrounding the second penetration electrode 34A.

As shown in FIG. 13B, the second conductor thin film 36A electrically connected to the second penetration electrode 34A faces the first conductor thin films 35A at one time, each of the first conductor thin films 35A being connected to corresponding four first penetration electrodes 33A. In FIG. 13B, a portion where the second conductor thin film 36A faces the first conductor thin films 35A in a plan view is shown with diagonal lines. In the present example, areas (hereafter referred to as S) where the second conductor thin film 36A faces each of the first conductor thin films 35A are the same.

In addition, as shown in FIG. 14, when a clearance between a pair of the first conductor thin film 35A and the second conductor thin film 36A in a lamination direction is d, relative dielectric constant of the dielectric layer 39 disposed between the first conductor thin film 35A and the second conductor thin film 36A is $\epsilon\gamma$, and dielectric constant is $\epsilon 0$, electrostatic capacity C1 in one of the four facing positions (indicated by an arrow F in FIG. 13B, for example) is obtained from a formula: $C1=\epsilon 0\times\epsilon\gamma\times S/d$.

In this case, a single second conductor thin film 36A faces four first conductor thin films 35A, so that four capacitors C1 are arranged in parallel in a plan view. Thus, total capacitance $C_{T1}$ of the single second conductor thin film 36A is obtained from a formula: $C_{T1}=(\epsilon 0\times\epsilon\gamma\times S/d)\times 4$. Further, as shown in FIG. 14, the capacitor sheet 3A is configured to alternately include the first conductor thin films 35A and the second conductor thin films 36A in a stacked manner and the electrostatic capacity of capacitors is changed in accordance with the number of the stacking.

Specifically, when the number of the stacking is increased, the number of capacitors is increased in parallel, so that the total electrostatic capacity is increased. When the number of capacitors formed with the conductor thin films 35A and 36A is n (integral number), the total electrostatic capacity C is obtained from a formula: $C=C_{T1}+C_{T2}+\ldots+C_{Tn}$.

The aforementioned LSI 1, electronic circuit board 2A, and capacitor sheet 3A are integrated in the following procedure. First, pasty solder is coated onto the pad portions 23a and 24a positioned on the upper surface of the electronic circuit board 2A.

Next, the capacitor sheet 3A is positioned and mounted on the electronic circuit board 2A such that the first penetration electrodes 33A are connected to the first board electrodes 23 and the second penetration electrode 34A are connected to the second board electrodes 24. Then, the terminal electrodes 11 of the LSI 1 are inserted into the first through-holes 37 of the capacitor sheet 3A.

Next, by melting the solder through heating processing and then cooling the solder, the LSI 1, electronic circuit board 2A, and capacitor sheet 3A are collectively soldered. However, a method for bonding the LSI 1, electronic circuit board 2A, and capacitor sheet 3A is not limited to the above-mentioned method.

By bonding the LSI 1, electronic circuit board 2A, and capacitor sheet 3A as mentioned above, power source electric potential is applied to the first conductor thin film 35A (and the terminal electrode 11 of the LSI 1) in the capacitor sheet 3A via the conductor layer 22a to the first board electrode 23 and then to first penetration electrode 33A. Also, ground electric potential is applied to the second conductor thin film 36A via the conductor layer 22b to the second board electrode 24 and then to second penetration electrode 34A.

In accordance with this, the first conductor thin film 35A and the second conductor thin film 36A function as a capacitor using both partially facing surfaces and dielectric. As a result, a capacitor is formed between each of the terminal electrodes 11 of the LSI 1 and the conductor layer 22b (grounding layer) of the electronic circuit board 2A.

According to the aforementioned capacitor sheet 3A according to above-mentioned the present example, it is possible to form plural capacitors for a single terminal electrode 11, the capacitors being made of the first conductor thin films 35A and the second conductor thin films 36A. Thus, it is possible to realize capacitors with sufficient electrostatic capacity (capacitance) capable of removing noises for the LSI 1.

Moreover, capacitors are formed closely to each of the terminal electrodes 11, so that it is possible to eliminate the problem of electric characteristics resulting from inductance components. Further, capacitor sheet 3A according to the present example has an independent capacitor form in each of the terminal electrodes 11, so that it is possible to eliminate the problem that a conventional sheet is used exclusively for a power source of the LSI and a terminal electrode for grounding.

Next, second to ninth examples of the present invention will be described with reference to FIGS. 15 to 27. In FIGS. 15 to 27, the same reference numerals are given to the same elements as those shown in FIGS. 5 to 14 used to describe the first example and description thereof is omitted.

Figure 15:
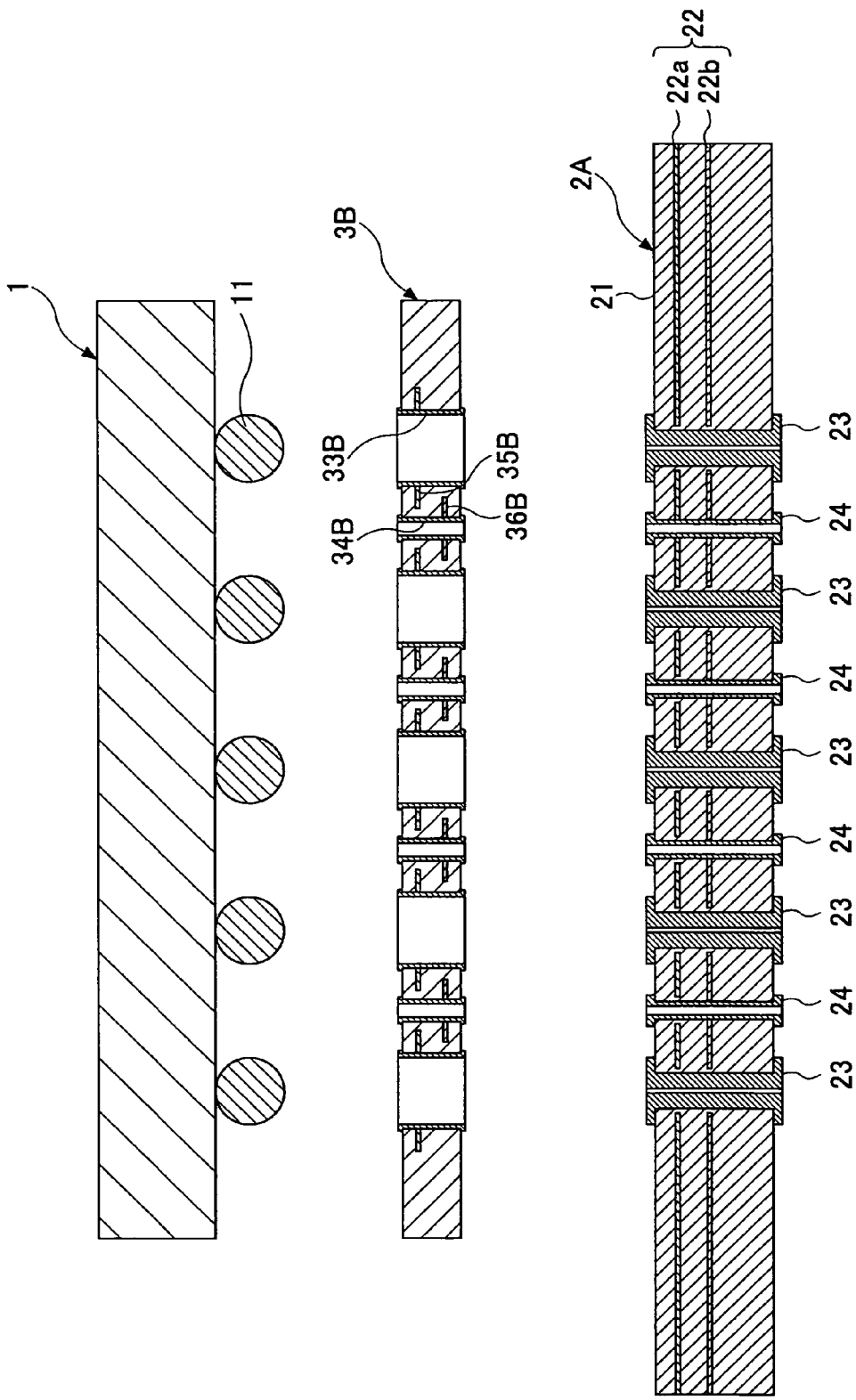
FIG. 15 is an exploded cross-sectional view describing a second example of the present invention.
Figure 16:
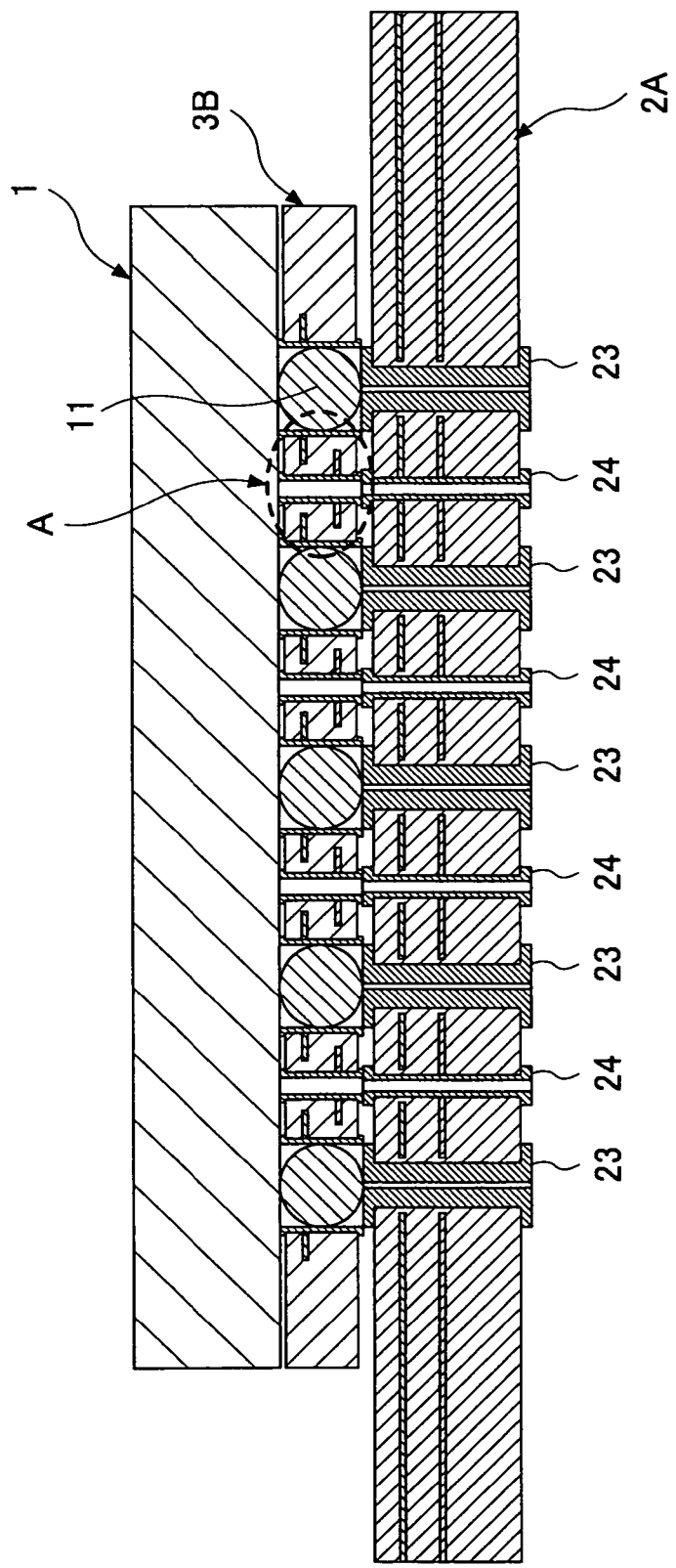
FIG. 16 is a cross-sectional view showing an electronic circuit board and an LSI mounted thereon, describing the second example of the present invention.
Figure 17:
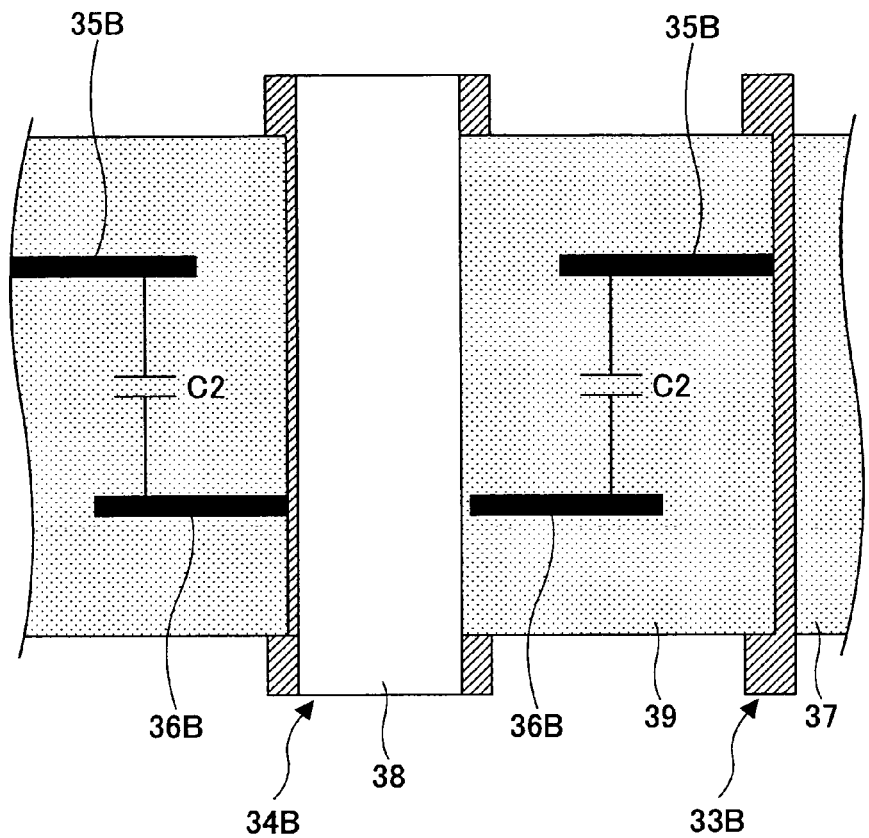
FIG. 17 is an enlarged view showing the vicinity of a first penetration electrode and a second penetration electrode on a capacitor sheet according to the second example of the present invention.

First, the second example will be described. FIGS. 15 to 17 show a capacitor sheet 3B according to the second example.

In the above-mentioned first example, plural first conductor thin films 35A are formed on the first penetration electrodes 33A and plural second conductor thin films 36A are formed on the second penetration electrodes 34A. By contrast, in the capacitor sheet 3B according to the present example, only a single first conductor thin film 35B is formed on a first penetration electrode 33B and only a single second conductor thin film 36B is formed on a second penetration electrode 34B. The number of capacitors formed in the capacitor sheet 3B is not limited to plural items but may be only one item as in the present example.

Figure 18:
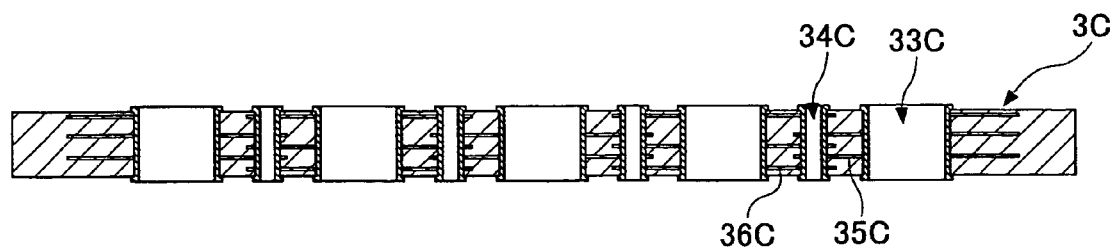
FIG. 18 is a cross-sectional view describing a third example of the present invention.
Figure 19:
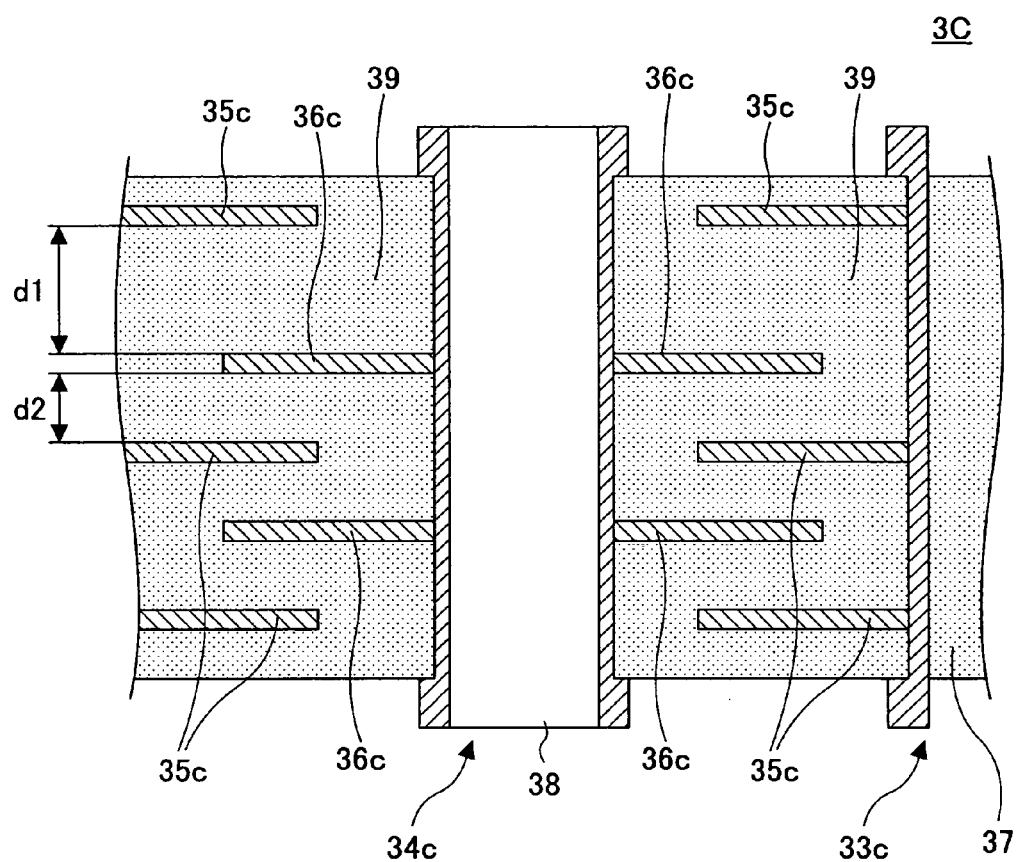
FIG. 19 is an enlarged cross-sectional view showing the vicinity of a first penetration electrode and a second penetration electrode on a capacitor sheet according to the third example of the present invention.

Next, the third example will be described. FIGS. 18 and 19 show a capacitor sheet 3C in the third example.

In the above-mentioned first example, the clearance d is assumed to be the same distance between all the first conductor thin films 35A and the second conductor thin films 36A disposed in an opposing manner. By contrast, in the capacitor sheet 3C according to the present example, clearances (d1 and d2) between first conductor thin films 35C and second conductor thin films 36C are different to each other (d1≠d2) in order to realize a desired electrostatic capacity (capacitance).

As mentioned above, areas where the conductor thin films 35C and 36C are disposed in an opposing manner is S, a clearance between the conductor thin films 35 and 36 is d, relative dielectric constant of the dielectric is $\epsilon\gamma$, and dielectric constant is $\epsilon 0$, so that capacitance C is obtained from a formula: $C=\epsilon 0\times\epsilon\gamma\times S/d$. Thus, when plural conductor thin films 35C and 36C are stacked for a certain terminal electrode 11 of the LSI 1 as in the present example, clearances between the first conductor thin films 35C and the second conductor thin films 36C may be different, namely, d1 for one pair and d2 for another pair, for example, among the plural conductor thin films 35C and 36C stacked.

Also, in each of the terminal electrodes 11 of the LSI 1, distance may be arbitrarily determined. In other words, all clearances between pairs of plural conductor thin films 35C and 36C disposed for a certain terminal electrode 11 may be distances d3 and all clearances between pairs of plural conductor thin films 35C and 36C disposed for another terminal electrode 11 may be distances d4 (d4≠d3).

In this manner, the clearances between plural pairs of the first conductor thin films 35C and the second conductor thin films 36C formed in the capacitor sheet 3C are not necessarily required to be all the same. It is possible to select as appropriate in accordance with electrostatic capacity differing in each of the terminal electrodes 11 of the LSI 1, thereby readily realizing capacitors with suitable electrostatic capacity in each of the terminal electrodes 11.

Figure 20:
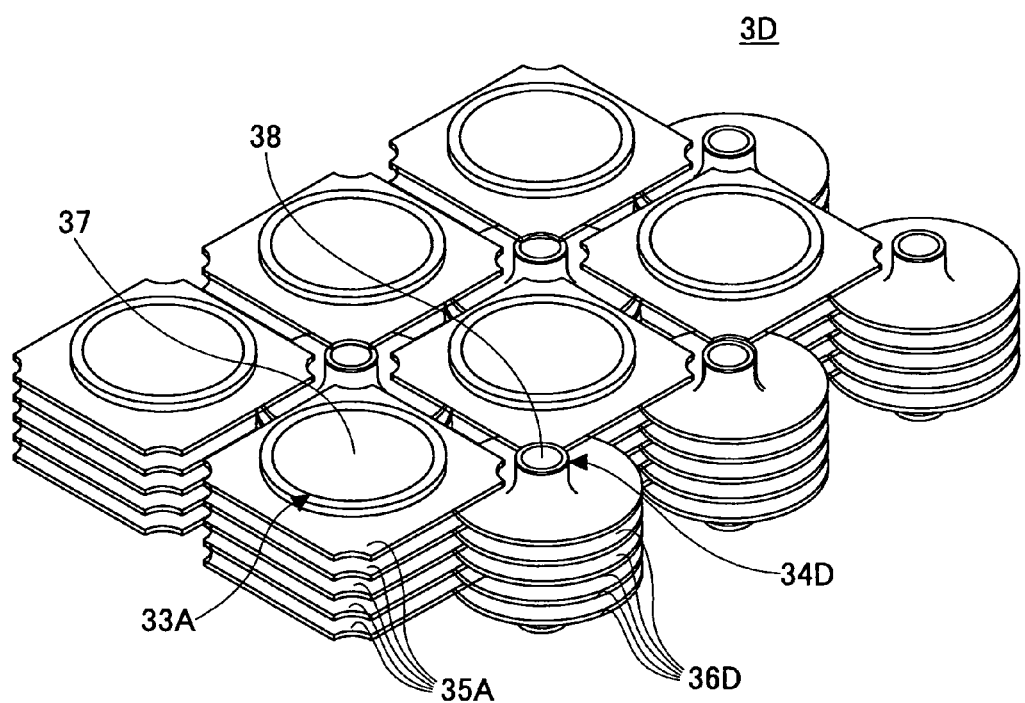
FIG. 20 is an enlarged perspective view showing the vicinity of a first penetration electrode and a second penetration electrode on a capacitor sheet according to a fourth example of the present invention.

Next, the fourth example will be described. FIG. 20 shows a capacitor sheet 3D according to the fourth example. In FIG. 20, the dielectric layer 39 is omitted for ease of description.

In the aforementioned first example, the form of the second conductor thin film 36A is a rectangle in a plan view, the rectangle having four corners chamfered to form curves. By contrast, in the capacitor sheet 3D according to the present example, a form of a second conductor thin film 36D is circular in a plan view.

The capacitor sheet 3D is configured to function as a capacitor by using the first conductor thin film 35A and the second conductor thin film 36D disposed in an opposing manner, so that the forms thereof are not limited as long as the first conductor thin films 35A and the second conductor thin films 36D are each disposed in an opposing manner. Thus, it is possible to set each of the first conductor thin films 35A and the second conductor thin films 36D to have a form capable of realizing a desired electrostatic capacity where appropriate, so that various forms may be used including a circle in a plan view as in the present example and other forms such as an ellipse, rhombus, and the like. In accordance with this, it is possible to adjust the electrostatic capacity of a capacitor to be formed.

Figure 21:
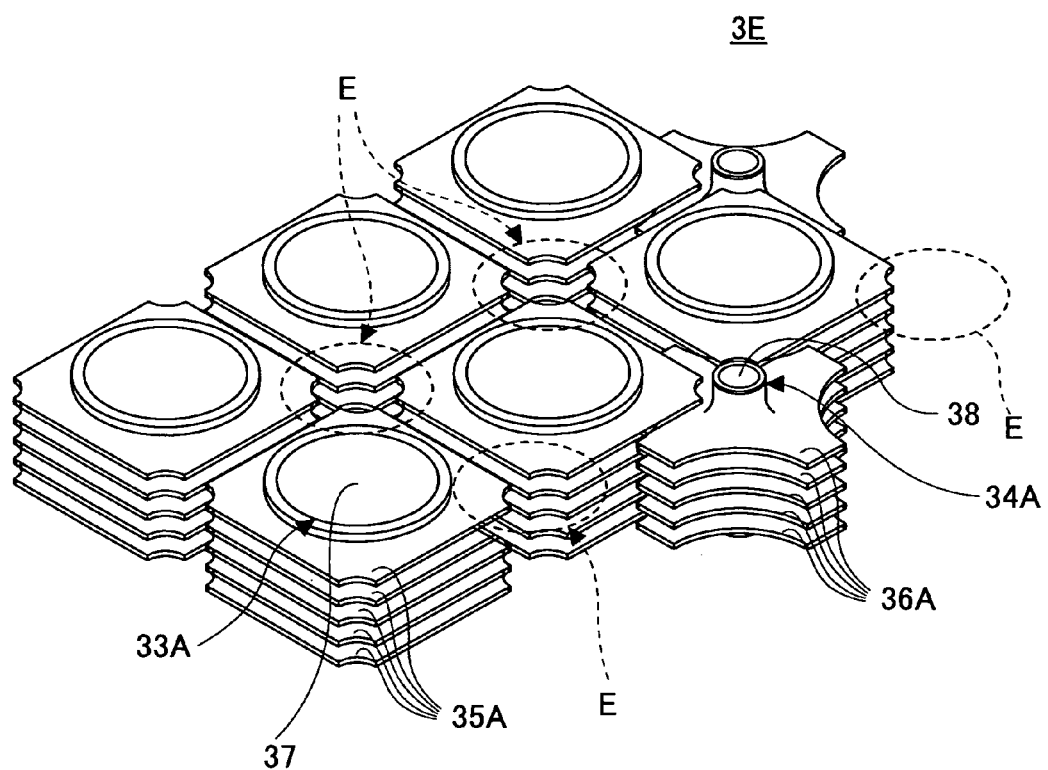
FIG. 21 is an enlarged perspective view showing the vicinity of a first penetration electrode and a second penetration electrode on a capacitor sheet according to a fifth example of the present invention.

Next, the fifth example will be described. FIG. 21 shows a capacitor sheet 3E according to the fifth example. In FIG. 21, the dielectric layer 39 is also omitted.

In the aforementioned first example, as shown in FIG. 12, in terms of a single first conductor thin film 35A, capacitors are formed at all the four corners thereof. By contrast, in the capacitor sheet 3E, in terms of the configuration of a single first conductor thin film 35A, capacitors are not formed at all the four corners thereof.

Specifically, the second penetration electrode 34A and the second conductor thin film 36A are not formed in areas shown in broken lines indicated by an arrow E in FIG. 21. As in this manner, capacitors are not necessarily to be formed at all the four corners of the first conductor thin film 35A or the second conductor thin film 36A. It is possible to select the number of the first penetration electrodes 33A (including the first conductor thin films 35A) and the second penetration electrodes 34A (including the second conductor thin films 36A) to be disposed and arrangement positions thereof such that an electrostatic capacity required in accordance with the properties of the terminal electrodes 11 is realized. Thus, in accordance with this configuration, it is also possible to adjust the electrostatic capacity of a capacitor to be formed.

Figure 22:
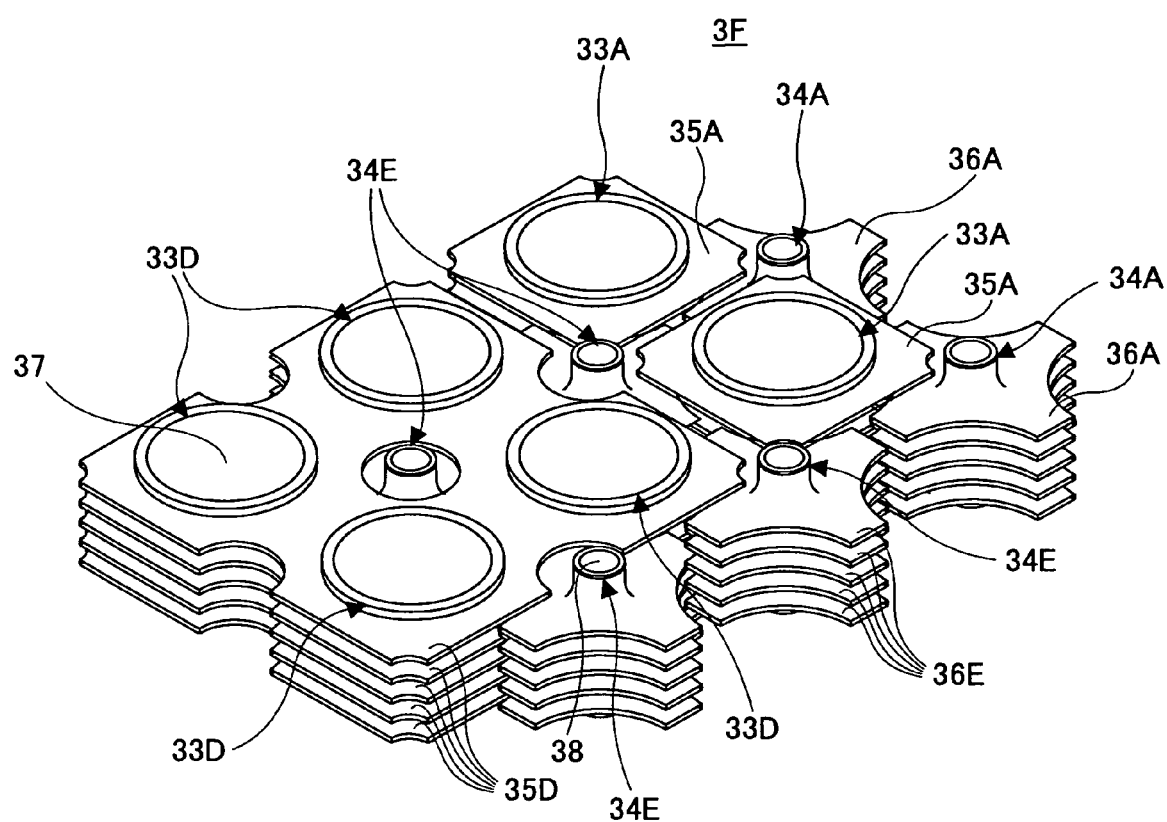
FIG. 22 is an enlarged perspective view showing the vicinity of a first penetration electrode and a second penetration electrode on a capacitor sheet according to a sixth example of the present invention.

Next, the sixth example will be described. FIG. 22 shows a capacitor sheet 3F according to the sixth example of the present invention. In FIG. 22, the dielectric layer 39 is also omitted.

In the aforementioned first example, as shown in FIG. 12, the first conductor thin film 35A to be connected only to a single first penetration electrode 33A is disposed and the first conductor thin film 35A is not shared with other first penetration electrode 33A. In the same manner, in a single second penetration electrode 34A, the second conductor thin film 36A to be connected only to the second penetration electrode 34A is disposed and the second conductor thin films 36A is not shared with other second penetration electrode 34A.

However, depending on the properties of the LSI 1 to be applied or when the terminal electrodes 11 having the same electric potential are serially arranged, the conductor thin films 36A are not necessarily to be dependent in each terminal electrode 11. The conductor thin films may be partially connected to plural terminal electrodes 11 or may be connected to all the terminal electrodes 11.

Accordingly, in the capacitor sheet 3F according to the present example, a first conductor thin film 35D for connecting to each of plural (four in the present example) first penetration electrodes 33D is disposed. In the same manner, a second conductor thin film 36E for connecting to each of plural (four in the present example) second penetration electrodes 34E is disposed.

By having such a configuration, the first conductor thin film 35D is used in common with the four first penetration electrodes 33D. This provides the same configuration as when four first conductor thin films 35A (in a plan view) according to the first example shown in FIG. 12 are integrated. Moreover, the second conductor thin film 36E is used in common with the four second penetration electrodes 34E. This provides the same configuration as when four second conductor thin films 36A (in a plan view) according to the first example shown in FIG. 12 are integrated.

According to the present example, a facing area S between the first conductor thin film 35D and the second conductor thin film 36E is increased, so that this configuration is effective when a large electrostatic capacity (capacitance) is required. In addition, by appropriately adjusting the number of the first penetration electrodes 33D and the second penetration electrodes 34E to be connected to the first conductor thin film 35D and the second conductor thin film 36E, respectively, it is possible to adjust the electrostatic capacity of a capacitor to be formed.

Figure 23:
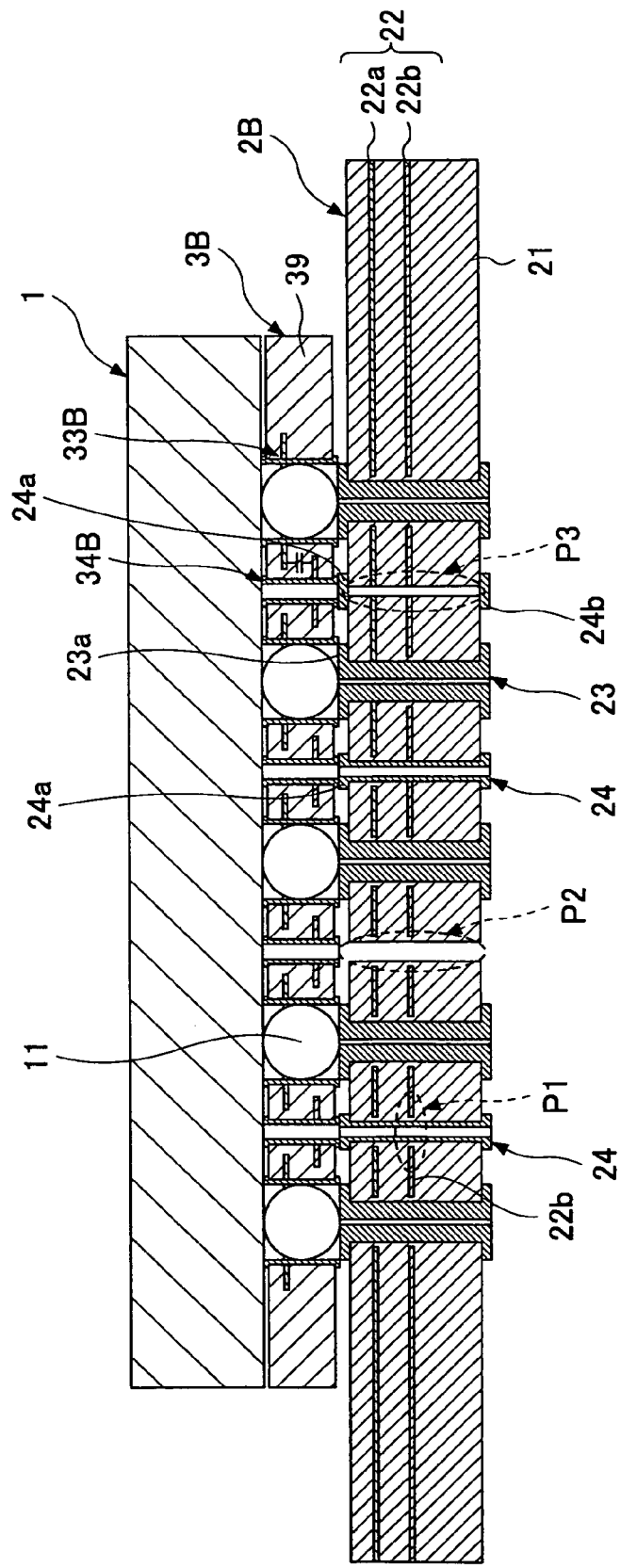
FIG. 23 is a cross-sectional view showing an electronic circuit board and an LSI disposed thereon, describing a seventh example of the present invention.

Next, the seventh example will be described with reference to FIG. 23.

Figure 8:
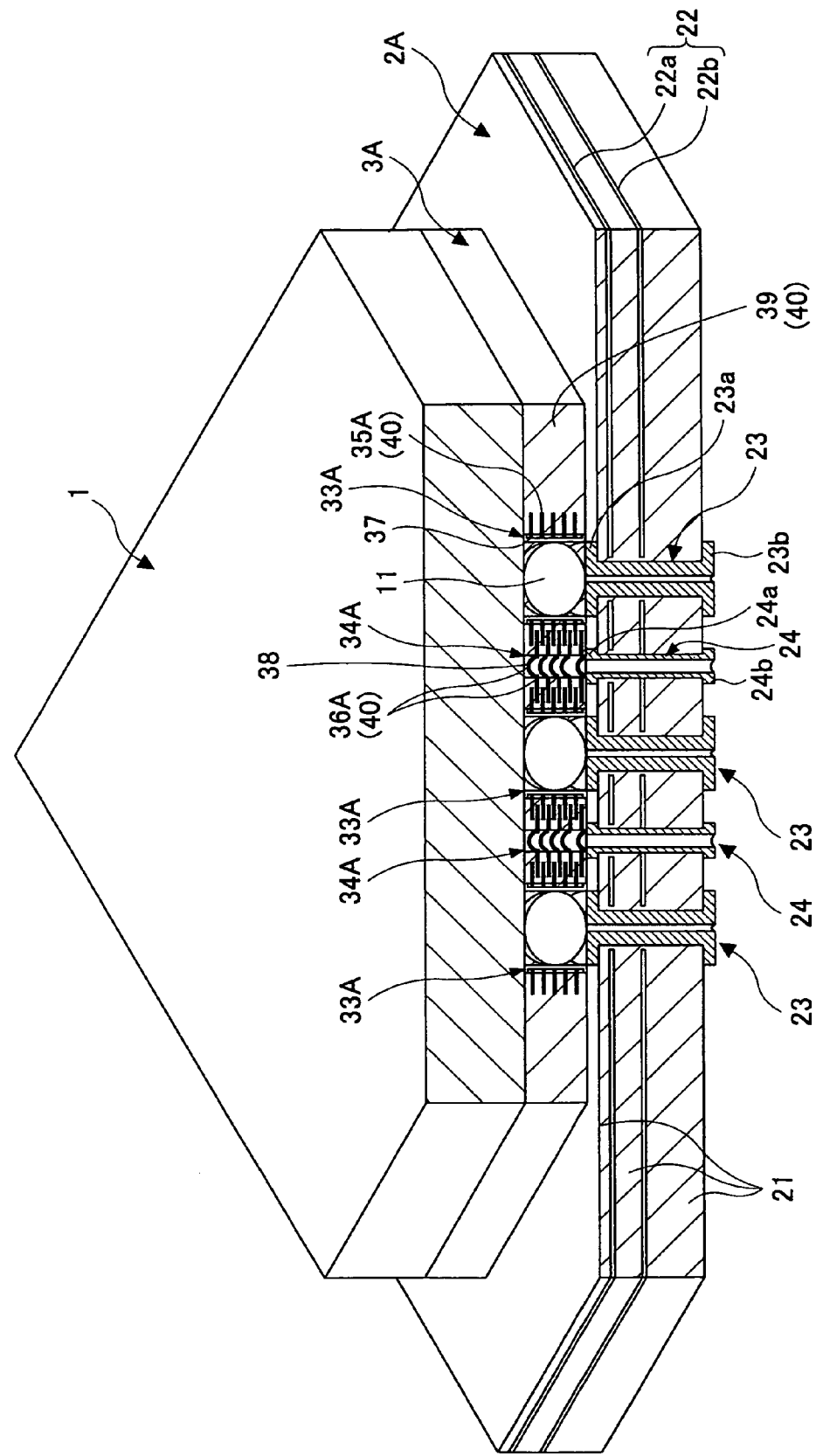
FIG. 8 is a partly-sectioned perspective view showing an LSI mounted on an electronic circuit board, describing the first example of the present invention.
Figure 9:
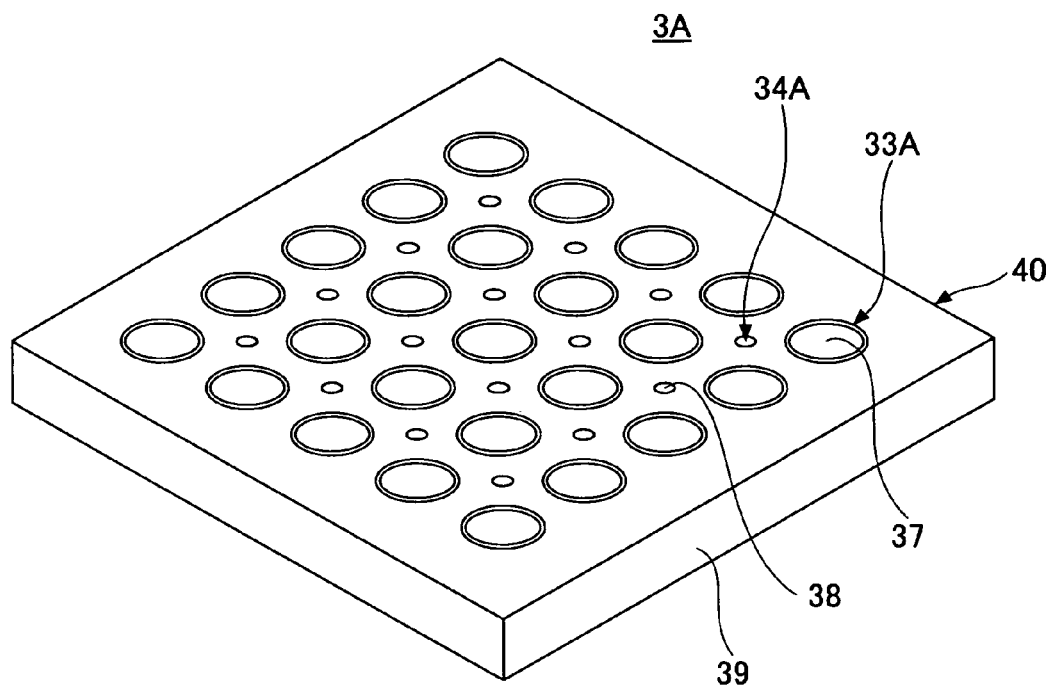
FIG. 9 is a perspective view showing a capacitor sheet according to the first example of the present invention.
Figure 10:
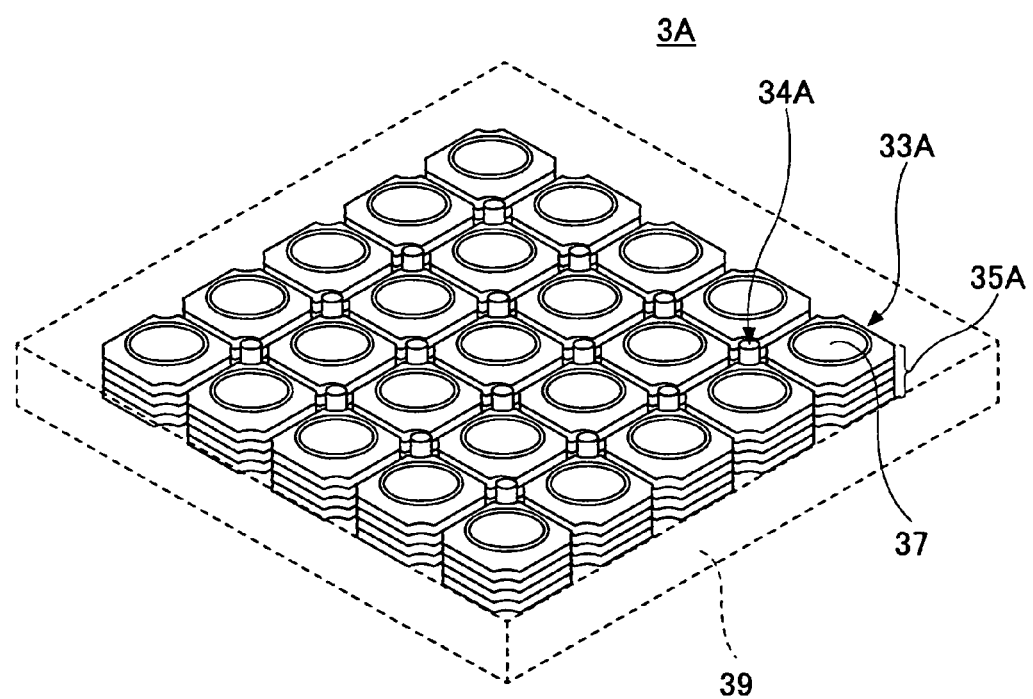
FIG. 10 is a perspective view showing a capacitor sheet according to the first example of the present invention in which a dielectric layer is removed.
Figure 11:
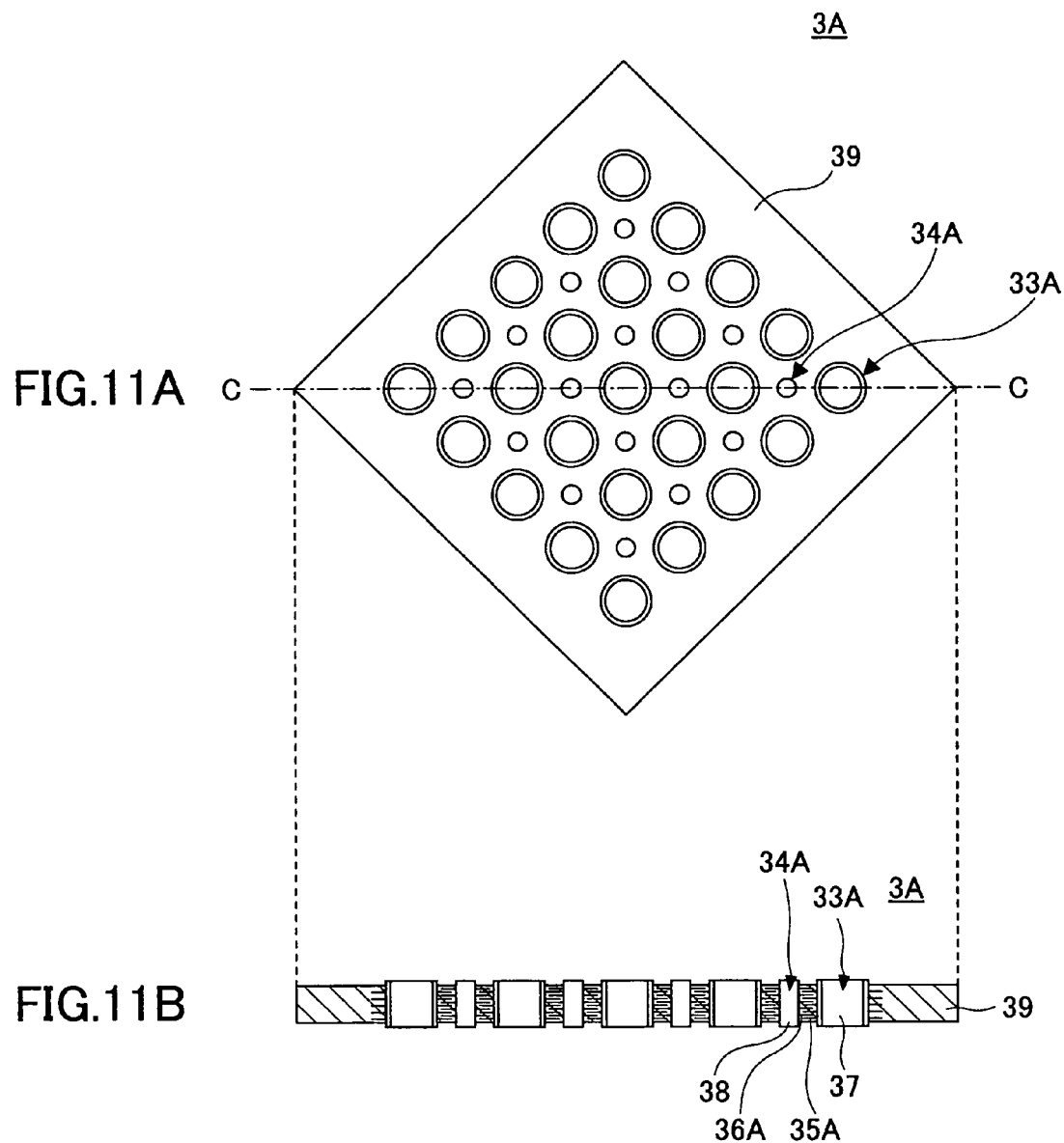
FIG. 11A is a plan view showing a capacitor sheet according to the first example of the present invention.
FIG. 11B is a cross-sectional view taken along line C-C of FIG. 11A.

In the aforementioned first example, as shown in FIG. 8, all the second board electrodes 24 are formed while penetrating the insulator layer 21 and all the second board electrodes 24 are electrically connected to the conductor layer 22b. In accordance with this, second penetration electrodes 34A and the second conductor thin films 36A have ground electric potential and capacitors are formed at all positions where the second conductor thin films 36B and the first conductor thin films 35B are disposed in an opposing manner.

By contrast, in the present example, the second board electrodes 24 on an electronic circuit board 2B are selectively insulated from the conductor layer 22b. By employing this configuration, the second penetration electrodes 34B and second conductor thin films 36B corresponding to the insulated second board electrodes 24 do not form a capacitor.

Specific configurations for insulating the second board electrodes 24 from the conductor layer 22b will be described with reference to FIG. 23. A configuration indicated by an arrow P1 in the figure is made so as not to connect the conductor layer 22b and the second board electrode 24. A configuration indicated by an arrow P2 is made so as to remove the second board electrode 24. And a configuration indicated by an arrow P3 is made so as to form only the pad portions 23a and 24a without forming the second board electrode 24 (including inner gold plating) therebetween.

By employing the above-mentioned configurations P1 to P3, the second penetration electrode 34B does not have ground electric potential, so that potential difference is not generated between the second conductor thin film 36B and the first conductor thin film 35B, the second conductor thin film 36B being disposed on the second penetration electrode 34B without ground electric potential. Thus, no capacitor is formed.

By employing such configurations in the present example, capacitors are selectively formed in the capacitor sheet 3B in the same manner as in the capacitor sheet 3E according to the fifth example shown in FIG. 21. In accordance with this, it is possible to adjust an entire electrostatic capacity in the capacitor sheet 3B.

In addition, the configurations without the formation of capacitors are not limited to the aforementioned configurations but may employ other configurations (in which the bonding between the capacitor sheet and the electronic circuit board is selectively performed, for example) as long as the potential difference between the conductor thin films 35B and 36B is not generated.

Figure 24:
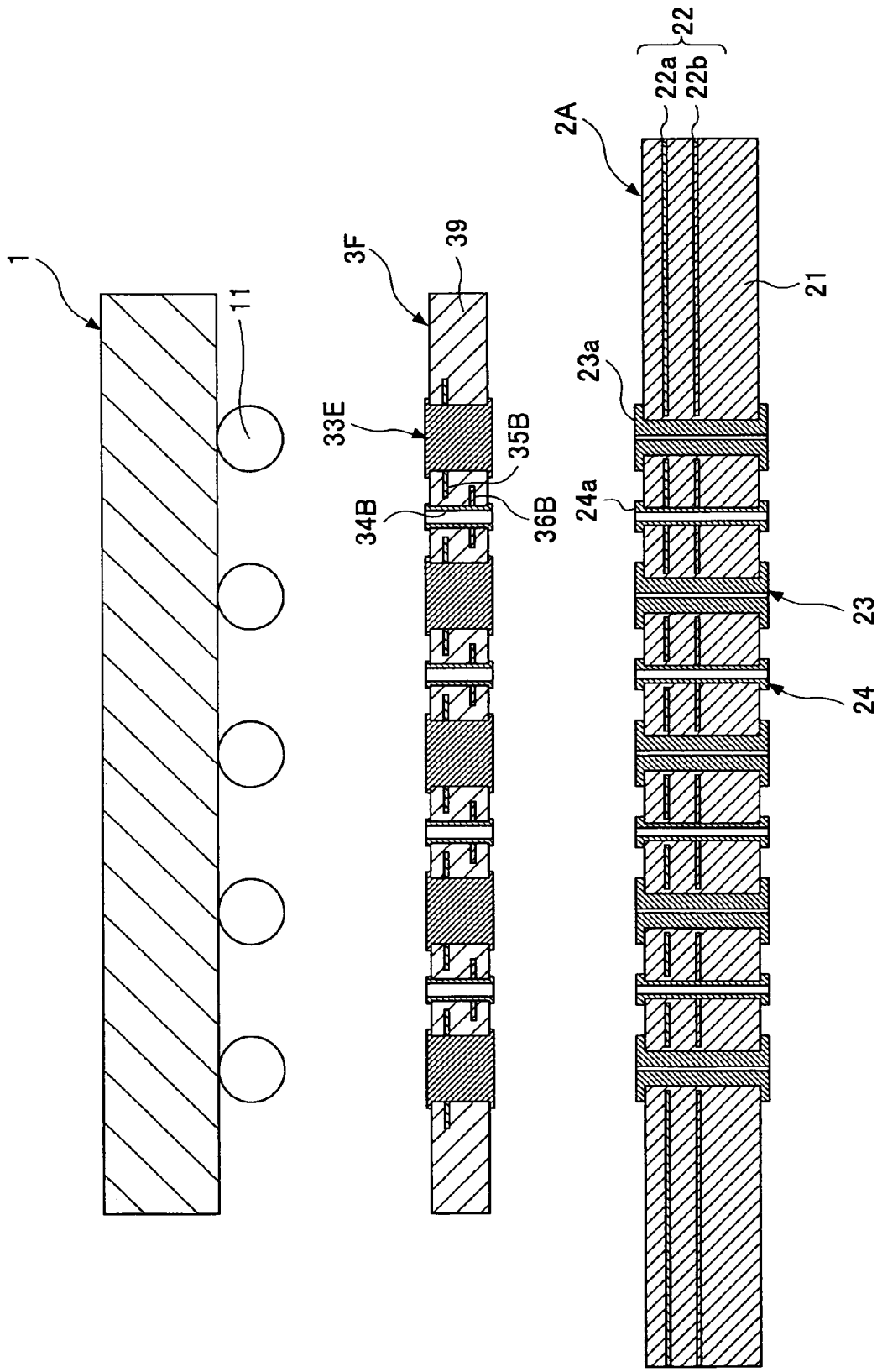
FIG. 24 is an exploded cross-sectional view describing an eighth example of the present invention.
Figure 25:
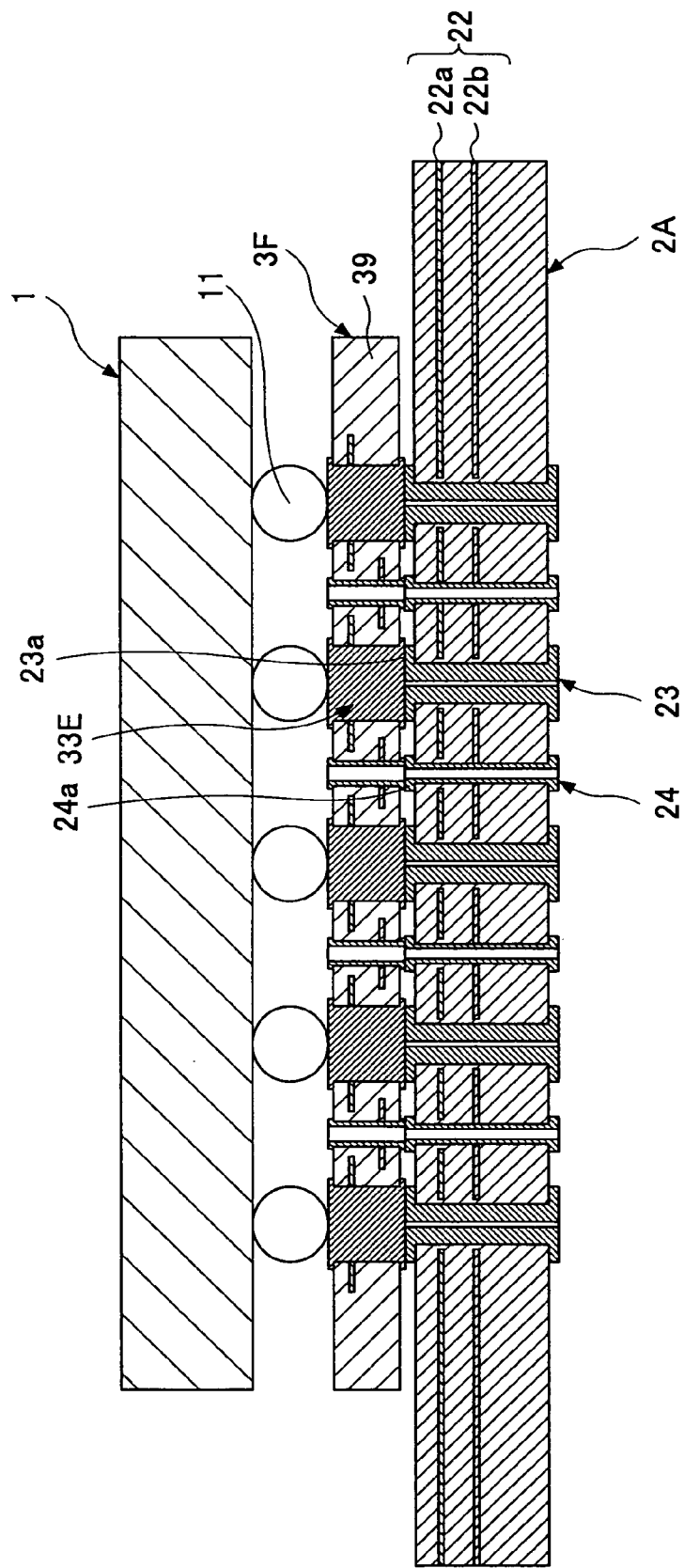
FIG. 25 is a cross-sectional view showing an electronic circuit board and an LSI disposed thereon, describing the eighth example of the present invention.

Next, the eighth example will be described with reference to FIGS. 24 and 25.

In the aforementioned first example, as shown in FIG. 8, the terminal electrodes 11 of the LSI 1 are inserted into the first through-holes 37 formed in the capacitor sheet 3A. By employing this configuration, it is possible to have good electric connection between the terminal electrodes 11 and the first penetration electrodes 33A.

However, when the number of terminal electrodes 11 to be disposed is increased due to a high density of mounting in the LSI 1, it is difficult to have an area where the first through-hole 37 into which the terminal electrode 11 is inserted is formed in the capacitor sheet 3A. Accordingly, in the capacitor sheet 3F according to the present example, the second through-hole 38 is not formed for a first penetration electrode 33E, a diameter of the first penetration electrode 33E is smaller in comparison with the first example, and an inner portion thereof is filled with a conductive metal.

According to the present configuration, it is possible to form the first penetration electrode 33E in a high-density manner and to support multiple pins of the LSI 1.

Figure 26:
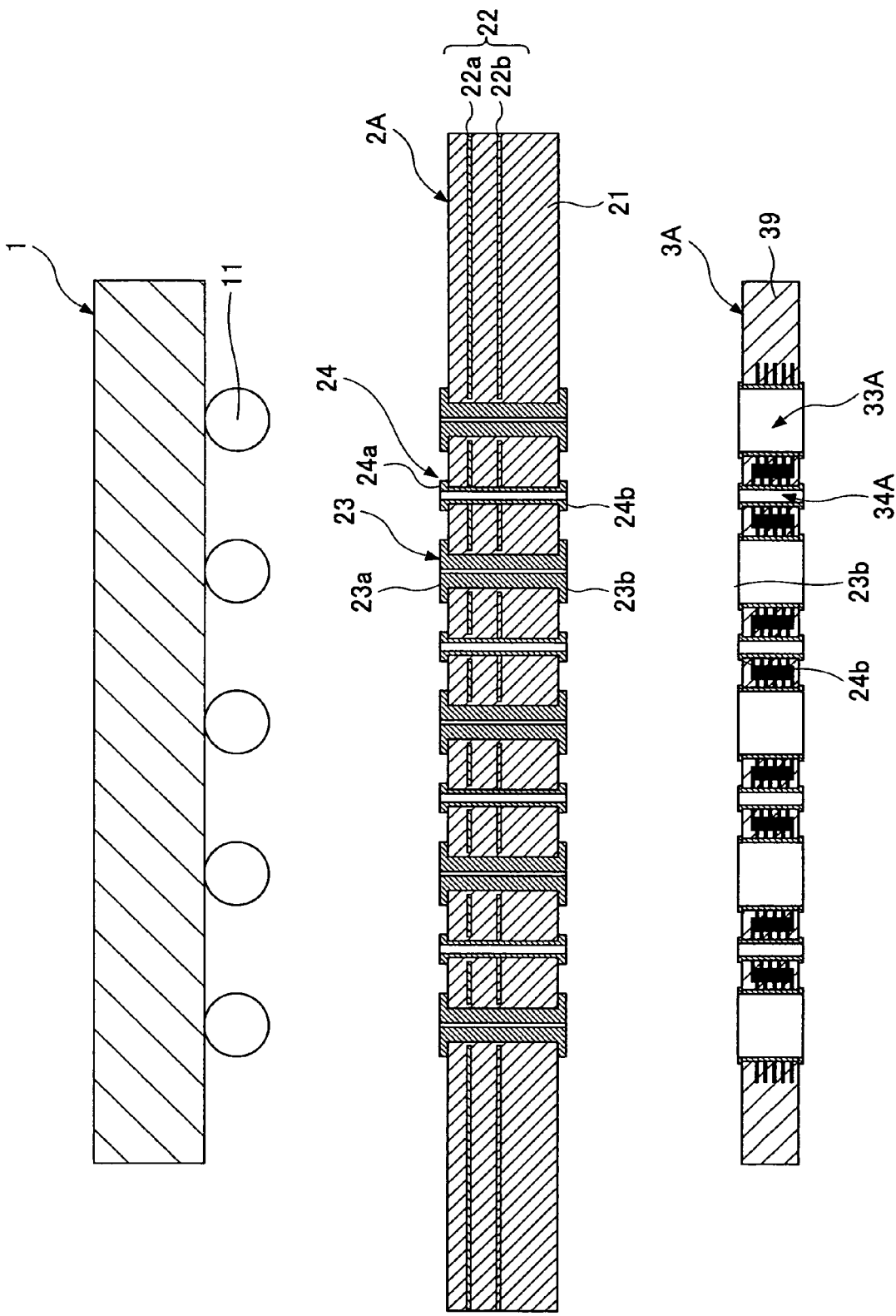
FIG. 26 is an exploded cross-sectional view describing a ninth example of the present invention.
Figure 27:
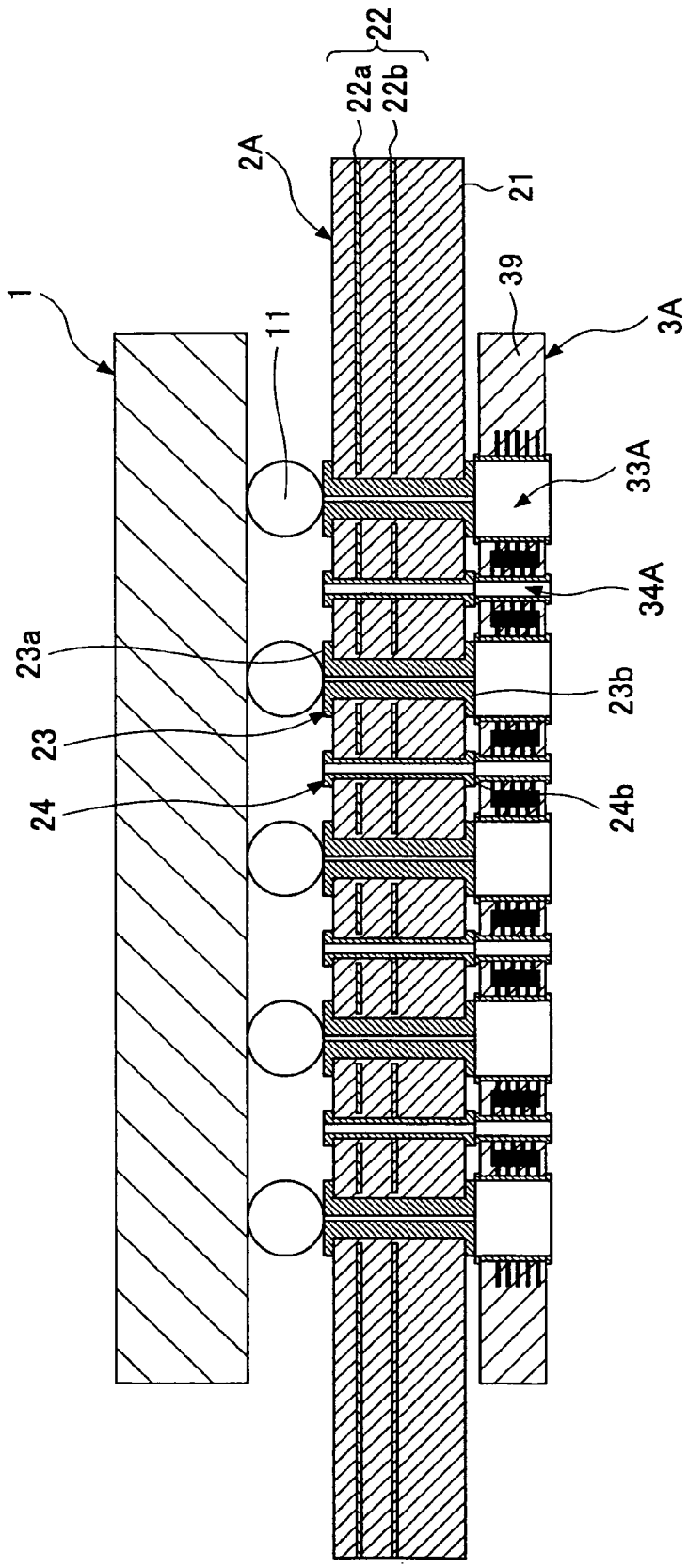
FIG. 27 is a cross-sectional view showing an electronic circuit board and an LSI mounted thereon, describing the ninth example of the present invention.

Next, the ninth example will be described with reference to FIGS. 26 and 27, In the aforementioned first example, the capacitor sheet 3A is held between the LSI 1 and the electronic circuit board 2A. However, the capacitor sheet is not necessarily to be disposed between the LSI 1 and the electronic circuit board 2A. The LSI 1 may be mounted on the electronic circuit board 2A and the capacitor sheet 3A may be mounted on a lower surface of the electronic circuit board 2A as in the present example.

Further, it is possible to embed the capacitor sheet in the LSI 1 in an integrated manner and to embed the capacitor sheet in the electronic circuit board in an integrated manner. In the case of such a configuration, the necessity of bonding the capacitor sheet 3A to the LSI 1 and the electronic circuit board upon mounting is eliminated and it is possible to miniaturize an entire apparatus made of the LSI 1, electronic circuit board, and capacitor sheet when mounted.

The present invention is not limited to the specifically disclosed embodiment, and variations and modifications may be made without departing from the scope of the present invention.

The present application is based on Japanese priority application No. 2006-072739 filed Mar. 16, 2006, the entire contents of which are hereby incorporated herein by reference.

What is claimed is:

1. A capacitor sheet for attachment to an electronic apparatus, comprising:
   a laminated body including a dielectric layer, a plurality of first conductor thin films and at least one second conductor thin film;
   a plurality of first penetration electrodes penetrating the laminated body;
   at least one second penetration electrode disposed at an arrangement position different from that of the first penetration electrodes on the laminated body, the second penetration electrode being electrically insulated from the first penetration electrodes and penetrating the laminated body;
   said plural first conductor thin films being electrically connected to the respective plural first penetration electrodes and insulated from the second penetration electrode; and
   said at least one second conductor thin film being electrically connected to the second penetration electrode and insulated from the first penetration electrodes;
   wherein said plural first conductor thin films electrically connected to the respective plural first penetration electrodes are insulated from one another and disposed so as to face the second conductor thin film at one time via the dielectric layer;
   in combination with an electronic apparatus,
      wherein at least one of the first penetration electrodes is set to correspond to a position of a terminal electrode of the electronic apparatus,
      wherein at least one of the second penetration electrodes is set to correspond to a position different from the position of the terminal electrode of the electronic apparatus.

2. The capacitor sheet according to claim 1, wherein said at least one second penetration electrode comprises a plurality of second penetration electrodes, and said at least one second conductor thin film comprises a plurality of second conductor thin films, the plural second conductor thin films being electrically connected to the respective plural second penetration electrodes,
   wherein said plurality of second conductor thin films electrically connected to the respective plural second penetration electrodes are insulated from one another and disposed so as to face the same first conductor thin film formed on one first penetration electrode at one time.

3. The capacitor sheet according to claim 1, wherein said at least one second conductor thin film comprises a plurality of second conductor thin films, and the plurality of second conductor thin films are electrically connected to the second penetration electrode and stacked in a lamination direction; and
   a clearance between at least one of the first conductor thin films and a second conductor thin film positioned above the first conductor thin film in the lamination direction is different from a clearance between the first conductor thin film and a second conductor thin film positioned below the first conductor thin film in the lamination direction.

4. The capacitor sheet according to claim 1, wherein upper ends and lower ends of the plurality of first penetration electrodes and the at least one second penetration electrode are configured and arranged to serve as external connection terminals.

5. The capacitor sheet according to claim 1, in combination with an electronic apparatus; wherein
the plurality of first penetration electrodes each have a through-hole for a respective terminal electrode formed on the electronic apparatus and the terminal electrode is inserted thereinto.

6. The capacitor sheet according to claim 1, wherein
said at least one second penetration electrode comprises a plurality of second penetration electrodes, and said at least one second conductor thin film comprises a plurality of second conductor thin films, the plural second conductor thin films being electrically connected to the respective plural second penetration electrodes, and
the plural second conductor thin films electrically connected to the plural second penetration electrodes are integrated with one another.

7. An electronic circuit board comprising:
a board electrode formed in an insulator layer; and
a capacitor sheet so as to connect the board electrode to first and second penetration electrodes, wherein
the capacitor sheet comprises:
a laminated body including a dielectric layer, a plurality of first first conductor thin films and at least one second conductor thin film;
a plurality of first penetration electrodes penetrating the laminated body;
at least one second penetration electrode disposed at an arrangement position different from that of the first penetration electrodes on the laminated body, the second penetration electrode being electrically insulated from the firstpenetration electrodes and penetrating the laminated body;
said plural first conductor thin films being electrically connected to the respective plural first penetration electrodes and insulated from the second penetration electrode; and
said at least one second conductor thin film being electrically connected to the second penetration electrode and insulated from the first penetration electrodes;
wherein said plural first conductor thin films electrically connected to the respective plural first penetration electrodes are insulated from one another and disposed so as to face the second conductor thin film at one time via the dielectric layer;
in combination with an electronic apparatus,
wherein at least one of the first penetration electrodes is set to correspond to a position of a terminal electrode of the electronic apparatus,
wherein at least one of the second penetration electrodes is set to correspond to a position different from the position of the terminal electrode of the electronic apparatus.

8. The electronic circuit board according to claim 7, wherein
the board electrode is selectively insulated.

9. The electronic circuit board according to claim 7, wherein
said at least one second penetration electrode comprises a plurality of second penetration electrodes, and said at least one second conductor thin film comprises a plurality of second conductor thin films, the plural second conductor thin films being electrically connected to the respective plural second penetration electrodes,
wherein said plurality of second conductor thin films electrically connected to the respective plural second penetration electrodes are insulated from one another and disposed so as to face the same first conductor thin film formed on one first penetration electrode at one time.

10. The electronic circuit board according to claim 7, wherein
said at least one second conductor thin film comprises a plurality of second conductor thin films, and the plurality of second conductor thin films are electrically connected to the second penetration electrode and stacked in a lamination direction; and
a clearance between at least one the first conductor thin films and a second conductor thin film positioned above the first conductor thin film in the lamination direction is different from a clearance between the first conductor thin film and a second conductor thin film positioned below the first conductor thin film in the lamination direction.

11. The electronic circuit board according to claim 7, wherein
upper ends and lower ends of the plurality of first penetration electrodes and the at least one second penetration electrode are configured and arranged to serve as external connection terminals.

12. The electronic circuit board according to claim 7, in combination
with an electronic apparatus; wherein
the plurality of first penetration electrodes each have a through-hole for a respective terminal electrode formed on the electronic apparatus and the terminal electrode is inserted thereinto.

13. The electronic circuit board according to claim 7, wherein
said at least one second penetration electrode comprises a plurality of second penetration electrodes, and said at least one second conductor thin film comprises a plurality of second conductor thin films, the plural second conductor thin films being electrically connected to the respective plural second penetration electrodes, and
the plural second conductor thin films electrically connected to the respective plural second penetration electrodes are integrated with one another.

14. The capacitor sheet according to claim 1, in combination with an electronic apparatus, wherein at least one of the first penetration electrodes is electrically connected to a terminal electrode of the electronic apparatus.

15. The capacitor sheet according to claim 1, wherein the plurality of first penetration electrodes is four first penetration electrodes, and the plurality of first conductive thin films is four first conductive thin films, and wherein the four first penetration electrodes surround the second penetration electrode so that the four first conductive thin films face the second conductive thin film at one time via the dielectric.

16. The capacitor sheet according to claim 1, wherein, in a lamination direction, there is only one layer of plural first conductor thin films electrically connected to respective plural first penetration electrodes.

17. The capacitor sheet according to claim 1, wherein the form of each of the plurality of first conductor thin films is circular in a plan view.

18. The capacitor sheet according to claim 1, wherein the form of the at least one second conductor thin film is circular in a plan view.

19. The electronic circuit board according to claim 7, in combination with an electronic apparatus, wherein at least one of the first penetration electrodes is electrically connected to a terminal electrode of the electronic apparatus.

20. The electronic circuit board according to claim 7, wherein the plurality of first penetration electrodes is four first penetration electrodes, and the plurality of first conductive thin films is four first conductive thin films, and wherein the four first penetration electrodes surround the second penetration electrode so that the four first conductive thin films face the second conductive thin film at one time via the dielectric.

21. The electronic circuit board according to claim 7, wherein, in a lamination direction, there is only one layer of plural first conductor thin films electrically connected to respective plural first penetration electrodes.

22. The electronic circuit board according to claim 7, wherein the form of each of the plurality of first conductor thin films is circular in a plan view.

23. The electronic circuit board according to claim 7, wherein the form of the at least one second conductor thin film is circular in a plan view.

* * * * *